US012665013B2

(12) United States Patent
Yang

(10) Patent No.: US 12,665,013 B2
(45) Date of Patent: *Jun. 23, 2026

(54) MEMORY DEVICES INCLUDING MECHANISM OF PROTECTING A VULNERABLE WORD LINE BASED ON THE PREVIOUS REFRESHED WORD LINES AND RELEVANT METHODS

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 126 days.

This patent is subject to a terminal disclaimer.

(21) Appl. No.: 18/796,379

(22) Filed: Aug. 7, 2024

(65) Prior Publication Data

US 2025/0218491 A1 Jul. 3, 2025

Related U.S. Application Data

(62) Division of application No. 18/401,758, filed on Jan. 2, 2024, now Pat. No. 12,431,185.

(51) Int. Cl.
*G11C 11/406* (2006.01)
*G06F 3/06* (2006.01)
(Continued)

(52) U.S. Cl.
CPC ...... *G11C 11/40622* (2013.01); *G06F 3/0604* (2013.01); *G06F 3/064* (2013.01);
(Continued)

(58) Field of Classification Search
CPC .......... G11C 11/40622; G11C 11/4078; G11C 11/4087; G11C 11/408; G11C 11/4085; G06F 3/0604; G06F 3/064; G06F 3/0673
(Continued)

(56) References Cited

U.S. PATENT DOCUMENTS 8,134,871 B2 * 3/2012 Dutta ................. G11C 16/0483
365/185.06
10,825,491 B2 * 11/2020 Moon ................. G11C 11/4072
(Continued)

FOREIGN PATENT DOCUMENTS

TW 202341144 A * 10/2023 ......... G11C 11/4063

OTHER PUBLICATIONS

Office Action and and the search report mailed on Sep. 11, 2025 related to U.S. Appl. No. 18/413,454.

*Primary Examiner* — Michael T Tran
(74) *Attorney, Agent, or Firm* — Xuan Zhang

(57) ABSTRACT

A memory device and a method for protecting the same are provided. The memory device includes: a random number generator, a counter, and a controller. The random number generator includes a first logic gate and a second logic gate configured to generate a first output and a second output, respectively, according to the address of the first word line and the address of the first accessed word line. The random number generator further includes a switch configured to select one of the first output and the second output to be a first number. The counter is configured to receive the first number and count down from the first number. The controller is configured to obtain an address of a second accessed word line being accessed when the counter counts down to zero, and refresh adjacent word lines of the second accessed word line during a second refresh cycle.

20 Claims, 14 Drawing Sheets

(51) Int. Cl.
     *G11C 11/4078*      (2006.01)
     *G11C 11/408*      (2006.01)

(52) U.S. Cl.
     CPC ........ *G06F 3/0673* (2013.01); *G11C 11/4078*
                   (2013.01); *G11C 11/4087* (2013.01)

(58) Field of Classification Search
     USPC ............................................. 365/222, 233.1
     See application file for complete search history.

(56)                    References Cited

U.S. PATENT DOCUMENTS

| | | | |
|---|---|---|---|
| 10,998,081 B1 * | 5/2021 | Park | G11C 29/52 |
| 11,222,686 B1 | 1/2022 | Noguchi | |
| 11,495,279 B1 | 11/2022 | Kwong et al. | |
| 2022/0004335 A1 * | 1/2022 | Khan | G06F 3/0604 |
| 2022/0199148 A1 * | 6/2022 | Hong | G11C 11/4091 |
| 2022/0293167 A1 * | 9/2022 | Cao | G11C 11/40611 |

* cited by examiner

4D

CBR+3 act_1    WL=1235

$Add_{CBR} = 1ABF$
$Add_{LRH} = 1235$
$S231_{hex} = 8A; S231_{dec} = 138$
$S232_{hex} = 35; S232_{dec} = 53$
$S233_{hex} = BF; S233_{dec} = 191$
$S234_{hex} = 40; S234_{dec} = 64$
$CDN_{hex} = 40; CDN_{dec} = 64$ act_2    WL=0021 act_3    WL=1235

. . .

act_63   WL=1235 act_64   WL=0021

. . .

act_N-1  WL=1235 act_N    WL=0021

CBR+4

$Add_{CBR} = 1AC0$
$Add_{LRH} = 0021$
$S231_{hex} = E1; S231_{dec} = 225$
$S232_{hex} = 00; S232_{dec} = 0$
$S233_{hex} = E1; S233_{dec} = 225$
$S234_{hex} = 1E; S234_{dec} = 30$
$CDN_{hex} = 61; CDN_{dec} = 97$

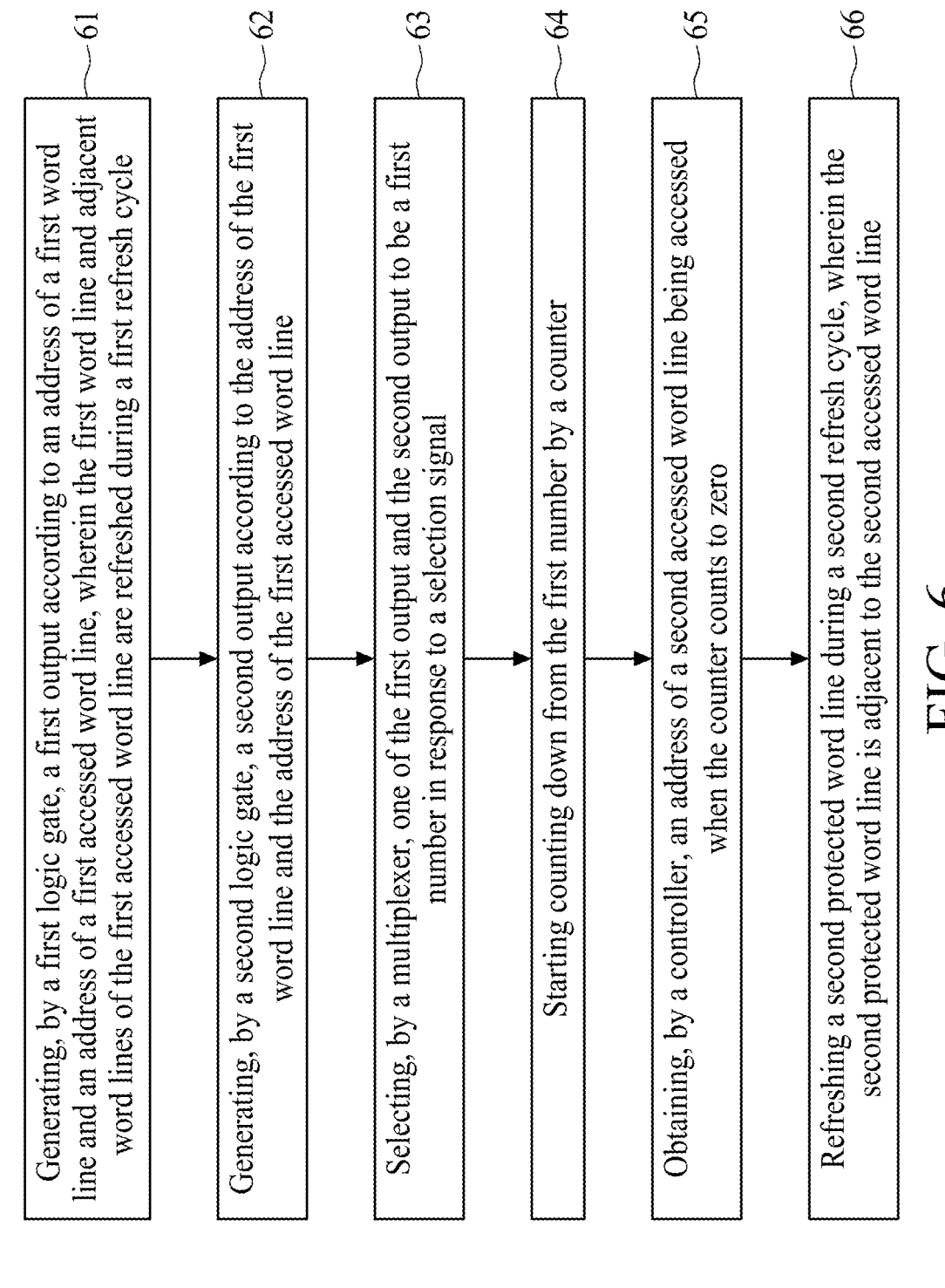

Generating, by a first logic gate, a first output according to an address of a first word line and an address of a first accessed word line, wherein the first word line and adjacent word lines of the first accessed word line are refreshed during a first refresh cycle — 61

Generating, by a second logic gate, a second output according to the address of the first word line and the address of the first accessed word line — 62

Selecting, by a multiplexer, one of the first output and the second output to be a first number in response to a selection signal — 63

Starting counting down from the first number by a counter — 64

Obtaining, by a controller, an address of a second accessed word line being accessed when the counter counts to zero — 65

Refreshing a second protected word line during a second refresh cycle, wherein the second protected word line is adjacent to the second accessed word line — 66

MEMORY DEVICES INCLUDING MECHANISM OF PROTECTING A VULNERABLE WORD LINE BASED ON THE PREVIOUS REFRESHED WORD LINES AND RELEVANT METHODS

CROSS-REFERENCE TO RELATED APPLICATION

This application is a divisional application of U.S. Non-Provisional application Ser. No. 18/401,758 filed Jan. 2, 2024, which is now patented having a U.S. Pat. No. 12,431, 185, which is incorporated herein by reference in its entirety.

TECHNICAL FIELD

The present disclosure relates to a memory device and a method of protecting the same, and more particularly, to a memory device including a protection circuit for protecting a word line.

DISCUSSION OF THE BACKGROUND

Dynamic random access memory (DRAM) stores each bit of data in a separate capacitor. A simple DRAM cell comprises a single transistor and a single capacitor. If charges are stored in the capacitor, the cell is said to store a logic HIGH, depending on the convention used. Then if no charge is present, the cell is said to store a logic LOW. Since the charges in the capacitor dissipate over time, DRAM systems require additional refreshing circuitry to periodically refresh the charges stored in the capacitors. Since a capacitor can store only a very limited amount of charges, in order to quickly distinguish the difference between a logic "1" and a logic "0", two bit-lines (BLs) are typically used for each bit, wherein the first in the bit line pair is known as a bit line true (BLT) and the other is the bit line complement (BLC). The single transistor's gate is controlled by a word line (WL).

Row hammer is a security issue originating with an unintended and undesirable side effect of DRAM, in which memory cells interact electrically among themselves by leaking their charges, potentially changing the content of nearby memory rows (word lines) not addressed in the original memory access. Row hammer can be triggered by specific memory access patterns that rapidly activate the same memory rows (word lines) multiple times. Accordingly, the memory cells connected to the adjacent word lines leak charges and have difficulty retaining original content through subsequent periodical refresh cycles. A malicious operator can use row hammer effect to change the content of nearby memory rows, resulting in device malfunction. Thus, it is called for to develop an approach of protecting a memory device (particularly, word lines thereof) to alleviate the problems described.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a memory device. The memory device includes a plurality of word lines, a random number generator, a counter, and a controller. The random number generator is configured to receive an address of a first word line and an address of a first accessed word line, wherein the first word line and adjacent word lines of the first accessed word line are refreshed during a first refresh cycle. The random number generator includes a first logic gate, a second logic gate, and a switch. The first logic gate is configured to generate a first output according to the address of the first word line and the address of the first accessed word line. The second logic gate is configured to generate a second output according to the address of the first word line and the address of the first accessed word line. The switch is electrically coupled to the first logic gate and the second logic gate, and configured to select one of the first output and the second output to be a first number. The counter is electrically coupled to the random number generator, and the counter is configured to receive the first number and count down from the first number. The controller is configured to obtain an address of a second accessed word line being accessed when the counter counts down from the first number to zero, and refresh adjacent word lines of the second accessed word line during a second refresh cycle.

Another aspect of the present disclosure provides a memory device. The memory device includes a plurality of word lines, a random number generator, a counter, an address register, and a controller. The random number generator is configured to receive an address of a first word line and an address of a first accessed word line, wherein the first word line and adjacent word lines of the first accessed word line are refreshed during a first refresh cycle. The random number generator includes a first logic gate, a second logic gate, and a switch. The first logic gate is configured to generate a first output according to the address of the first word line and the address of the first accessed word line. The second logic gate is configured to generate a second output according to the address of the first word line and the address of the first accessed word line. The switch is electrically coupled to the first logic gate and the second logic gate, and configured to select one of the first output and the second output to be a first number. The counter is electrically coupled to the random number generator, and configured to receive the first number and count down from the first number. The address register is electrically coupled to the counter, and configured to store an address of a second accessed word line being active when the counter counts down to zero. The controller is configured to access the address register to obtain the address of the second accessed word line, and protect adjacent word lines of the second accessed word line during a second refresh cycle.

Another aspect of the present disclosure provides a method for protecting a memory device, wherein the memory device includes a plurality of word lines. The method includes generating, by a first logic gate, a first output according to an address of a first word line and an address of a first accessed word line, wherein the first word line and adjacent word lines of the first accessed word line are refreshed during a first refresh cycle; generating, by a second logic gate, a second output according to the address of the first word line and the address of the first accessed word line; selecting, by a multiplexer, one of the first output and the second output to be a first number in response to a selection signal; starting counting down from the first number by a counter; obtaining, by a controller, an address of a second accessed word line being accessed when the counter counts to zero; and refreshing a second protected word line during a second refresh cycle, wherein the second protected word line is adjacent to the second accessed word line.

The embodiments of the present disclosure provide a memory device having a protection circuit for selecting and protecting a vulnerable word line. In particular, the protection circuit of the memory device can protect word lines (memory cells) from row hammer. To trigger the row hammer, the malicious operator rapidly activates the same memory rows, such that the charges on adjacent memory rows that are not activated may leak. The present protection circuit provides a random number generator and a counter, so as to randomly select and protect a possible attacked memory row. The counter can be configured to count down from a random number generated by the random number generator. When the counter reaches zero, an address of the memory row that is activated can be obtained. In other words, the memory row is selected from those activated between refresh cycles. In such a case, the selection pool includes the memory rows activated between refresh cycles. The random number generator can generate the random number based on the address of the last refreshed word line address and the address of the last accessed word line (the selected possible attacked word line), such that unpredictability of the random number increases. In particular, the random number generator can include one or more logic gates which generate a random number according to the refreshed word line address and the target word line address in the last refresh cycle. The random number generator can further include a switch to select among the outputs of the logic gates to be the random number output to the counter, rendering the number generated by the random number generator more difficult to predict.

In addition, to avoid the random number generated by the random number generator exceeding the maximum number of activations between refresh cycles, the number trimmer modifies the random number to a range from zero to a predetermined number (i.e., the maximum number of activations between refresh cycles). Because the memory rows adjacent to the activated memory rows are more vulnerable to row hammer effect, they will be protected in the subsequent refresh cycle.

Generally, the activation amount triggering row hammer cannot be accomplished within two refresh cycles. For example, a memory device with 8192 rows can have about 170 activations between refresh cycles, and the activation amount for triggering the row hammer may be 10000 or more in the same row. Therefore, protecting additional vulnerable memory rows in every refresh cycle can eliminate the row hammer issue. Furthermore, the memory device can include a number trimmer circuit to determine whether the random number, for choosing one among memory rows, exceeds the maximum number of activations between refresh cycles (i.e., 170 in this case), and then decrease the random number to a range from 0 to 170, improving security and performance of the memory device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It can also be appreciated by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

5

Figure 1:
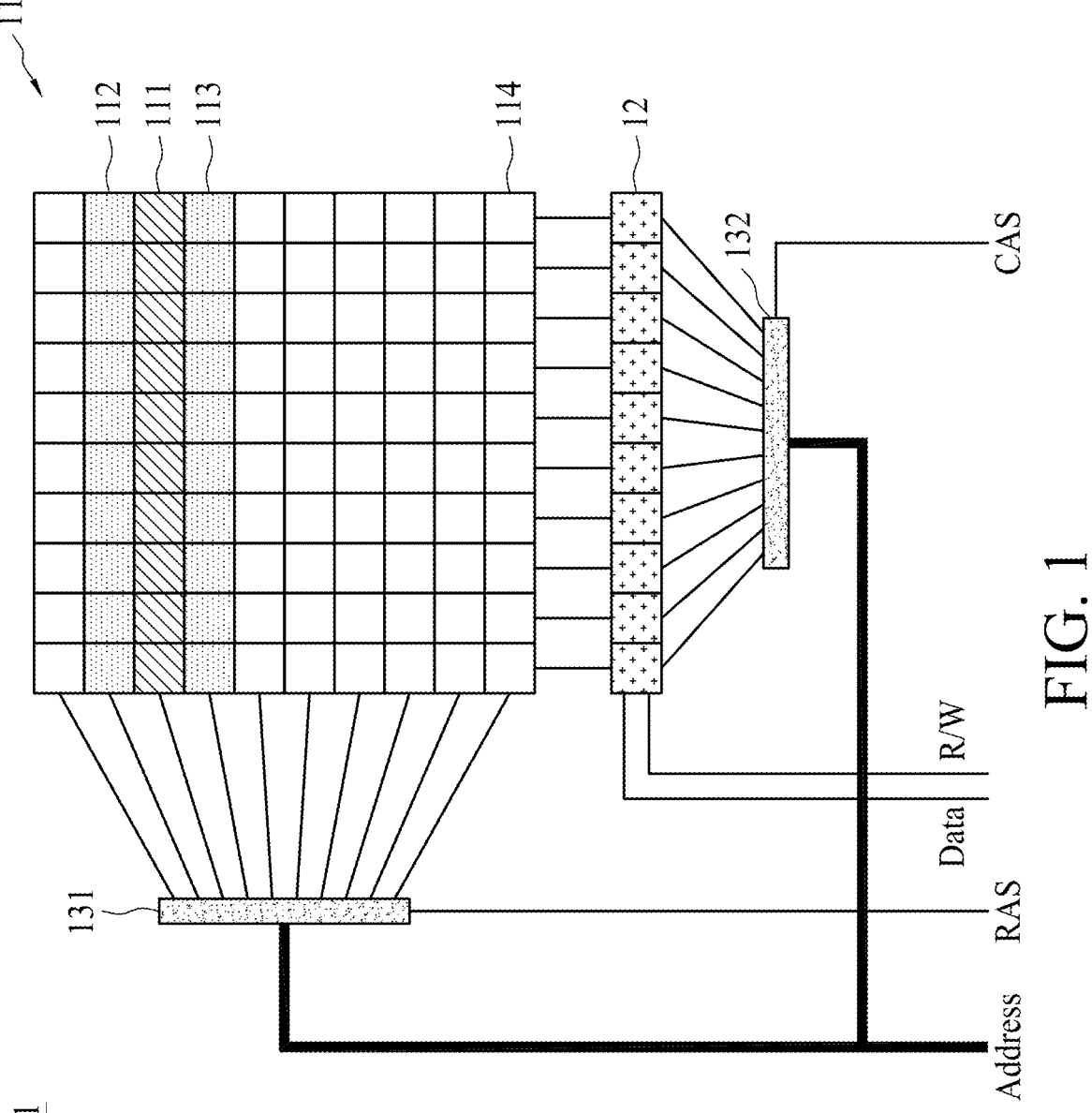
FIG. 1 is a schematic diagram of a memory device, in accordance with some embodiments of the present disclosure.

FIG. 6 is a flowchart of a method for protecting a memory device, in accordance with some embodiments of the present disclosure.

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a schematic diagram of a memory device 1, in accordance with some embodiments of the present disclosure. The memory device 1 can include an array of memory cells 11, sense amplifiers 12, a row address decoder 131, and a column address decoder 132. In some embodiments, the memory device 1 can be a DRAM.

Referring to FIG. 1, the array of memory cells 11 can include multiple rows and columns. Each column of memory cells can share one bit line or a pair of bit lines. Each row of memory cells can share one word line. In some embodiments, a single memory cell can include a capacitor and a transistor, and be configured to store a bit of data therein. The charge state of a capacitor (charged or discharged) can determine whether such memory cell stores "1" or "0" as a binary value.

In some embodiments, the memory address of the array of memory cells 11 applied to a matrix can be expressed as the row address and column address, which are processed by the row address decoder 131 and column address decoder 132. When the row address decoder 131 selects a particular row (for example, memory row 114) for a read operation (the selection is also known as row activation), bits from all memory cells in the particular row can be transferred into the sense amplifiers 12. In some embodiments, one sense amplifier 12 is for each column of memory cells to temporarily hold the data. In some embodiments, the column address decoder 132 can select the exact bit from one of the sense amplifiers 12. In some embodiments, the sense amplifiers 12 can be configured to receive or transmit the data in response to the read/write signal R/W. Write operations decode the addresses in a similar way, but entire rows can be rewritten for the value of a single bit to be changed.

Due to storing data bits in capacitors that have a natural discharge rate, the state stored in the memory cells 11 may lose over time and thus periodic rewriting of all memory cells is required, which is a process known as refreshing, in order to preserve the information stored on the memory cells. Each memory refresh cycle can refresh one or more rows of memory cells, and all the memory cells can be refreshed repeatedly in a consecutive cycle. The memory refresh can be accomplished in multiple types. In some embodiments, the memory refresh can be conducted by different patterns of signals, such as row address strobe (RAS) refresh, column-address-strobe-before-row-address-strobe (CAS-before-RAS) refresh (also called CBR refresh for short), and hidden refresh.

To trigger the row hammer, the same memory row 111 can be activated in a high frequency and amount. When the frequency and amount of activation to the memory row 111 is great enough, charges on the adjacent memory rows 112 and 113 that are not activated may leak and thus the data/content stored therein may lose.

The present protection circuit provides a random number generator and a counter (detailed description thereof can be found in FIG. 3), so as to randomly select and protect a possible memory row. The counter can be configured to count down from a random number generated by the random number generator. When the counter reaches zero, an address of the memory row (such as the memory row 111) that is activated can be obtained. In other words, the memory row is selected from those activated between refresh cycles. The nearby memory rows 112 and 113 adjacent to the activated memory row 111 have a higher possibility of experiencing row hammer effect, and thus they will be protected in the subsequent refresh cycle. In some embodiments, the memory rows 112 and 113 and a planned refresh memory row 114 can be refreshed in the subsequent refresh cycle.

Figure 2:
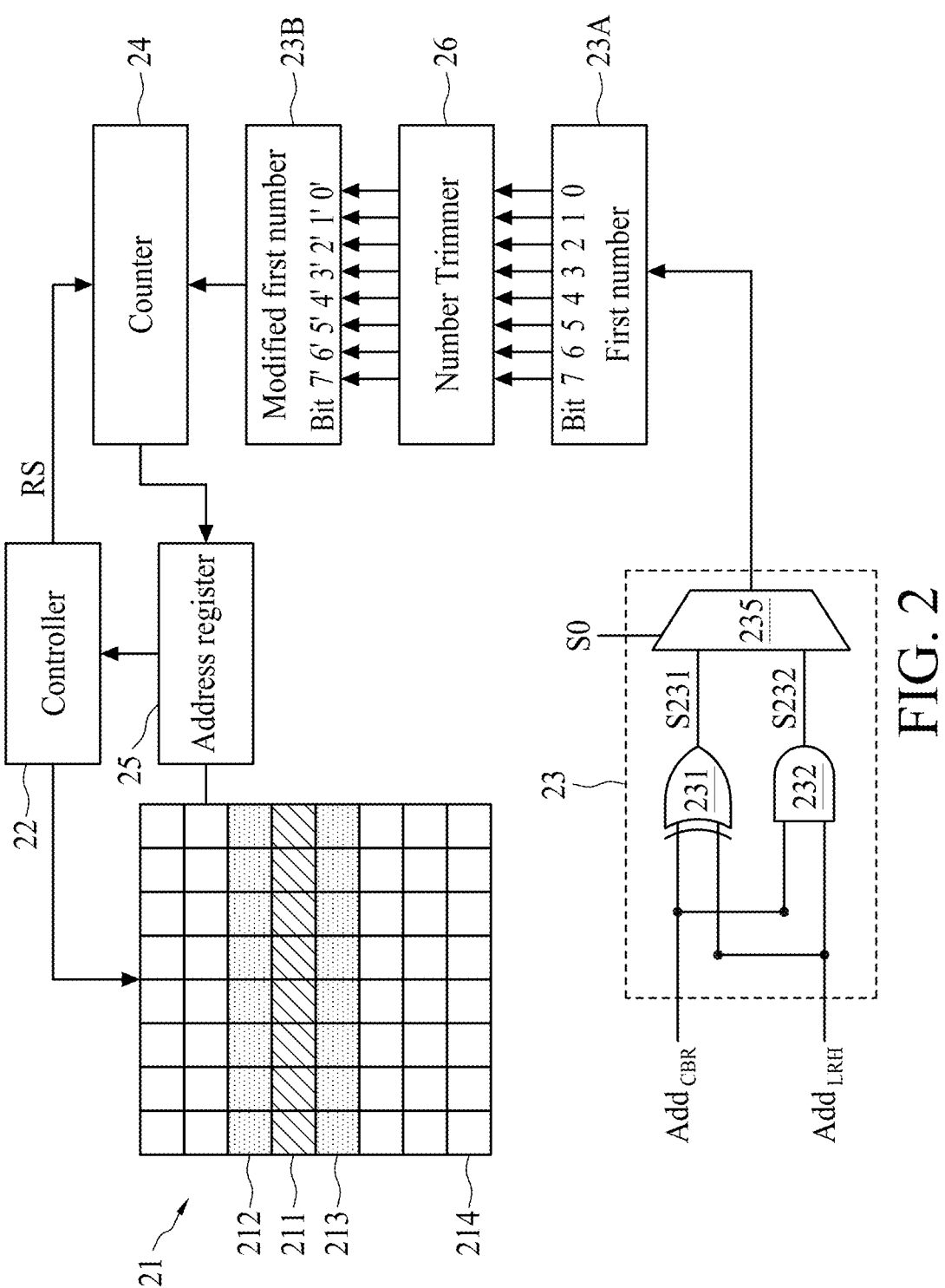
FIG. 2 is a schematic diagram of a memory device, in accordance with some embodiments of the present disclosure.

FIG. 2 is a schematic diagram of a memory device 2, in accordance with some embodiments of the present disclosure. Referring to FIG. 2, the memory device 2 can include an array of memory cells 21, a controller 22, a random number generator 23, a counter 24, an address register 25, and a number trimmer 26. In some embodiments, the memory device 2 can be a dynamic random-access memory (DRAM).

In some embodiments, the array of memory cells 21 can include a plurality of word lines. In some embodiments, the array of memory cells 21 can include a possible target word line 211 being accessed, i.e., the row hammer target, two adjacent word lines 212 and 213 adjacent to the possible target word line 211, and a normal word line 214. The normal word line 214 can be located anywhere in the array 21. For example, the normal word line 214 can be the edge word line or a word line sandwiched by two word lines. In one embodiment, the normal word line 214 can be separate from the possible target word line 211. In another embodiment, the normal word line 214 can be adjacent to the possible target word line 211 (not shown).

The controller 22 can be configured to refresh at least one of the word lines during a first refresh cycle by providing a refresh signal RS. In some embodiments, the refresh signal RS may be generated by the controller 22 itself based on a clock signal. In another embodiment, the controller 22 can be configured to refresh at least one of the word lines during a first refresh cycle in response to a refresh signal RS. In such embodiments, the controller 22 may receive the refresh signal RS from other elements (not shown). In some embodiments, the refresh signal RS can be RAS refresh command or CBR refresh command. The controller 22 can be configured to refresh one or more word lines during one refresh cycle. In some embodiments, the controller 22 can be configured to refresh one, two, three, four, or more word lines at the same time. In some embodiments, the controller 22 can be configured to refresh all of the array of memory cells 21 cycle by cycle. In some embodiments, the controller 22 can be configured to refresh all of the array of memory cells 21 in a predetermined pattern, i.e., a refresh pattern.

The random number generator 23 can be configured to generate a first number 23A. The first number 23A can be a positive integer. In some embodiments, the first number 23A can be in binary. The first number 23A can be represented by a binary sequence having more than 2 bits. For example, the first number 23A can be represented by a binary sequence having 8 bits. That is, the first number 23A can be a number in a range of 0 to 255. In other embodiments, the first number 23A can be more or less than 8 bits.

The random number generator 23 can be configured to receive an address of the word line $Add_{CBR}$ refreshed in the previous refresh cycle and an address of the accessed word line $Add_{LRH}$, i.e., the possible target row hammer word line located in the previous refresh cycle. In some embodiments, the random number generator 23 can be configured to generate the first number 23A according to the address of the word line $Add_{CBR}$ (for example, the word line 214) and the address of the accessed word line $Add_{LRH}$ (for example, the word line 211).

In some embodiments, the address of the word line $Add_{CBR}$ and the address of the accessed word line $Add_{LRH}$ can each be represented by a hexadecimal sequence having 4 bits. The address of word lines represented by a hexadecimal sequence having 4 bits can be converted to a binary sequence having 16 bits.

Referring to FIG. 2, the random number generator 23 can include one or more logic gates 231 and 232 and a switch 235. In some embodiments, the logic gates 231 and 232 can include different types of logic gates. The logic gates 231 and 232 can include OR gates, AND gates, NOR gates, NAND gates, XOR gates, XNOR gates and so on. For example, the logic gate 231 can be a XOR gate and the logic gate can be an AND gate.

The logic gate 231 can have a first input terminal receiving the address of the word line $Add_{CBR}$, a second input terminal receiving the address of the accessed word line $Add_{LRH}$, and an output terminal outputting a first output S231. The logic gate 231 can be configured to generate the first output S231 according to the address of the word line $Add_{CBR}$ and the address of the accessed word line $Add_{LRH}$. In some embodiments, the logic gate 231 can be configured to generate the first output S231 according to a part of the address of the word line $Add_{CBR}$ and a part of the address of the accessed word line $Add_{LRH}$.

The logic gate 232 can have a first input terminal receiving the address of the word line $Add_{CBR}$, a second input terminal receiving the address of the accessed word line $Add_{LRH}$, and an output terminal outputting a second output S232. The logic gate 232 can be configured to generate the second output S232 according to the address of the word line $Add_{CBR}$ and the address of the accessed word line $Add_{LRH}$. In some embodiments, the logic gate 232 can be configured to generate the first output S232 according to a part of the address of the word line $Add_{CBR}$ and a part of the address of the accessed word line $Add_{LRH}$.

In some embodiments, the first input terminal of the logic gate 231 can be connected to the first input terminal of the logic gate 232, so as to receive the address of the word line $Add_{CBR}$. The second input terminal of the logic gate 231 can be connected to the second input terminal of the logic gate 232, so as to receive the address of the accessed word line $Add_{LRH}$.

Although the logic gates 231 and 232 receive the same inputs, i.e., the address of the word line $Add_{CBR}$ and the address of the accessed word line $Add_{LRH}$, the first output S321 and the second output S322 can be different since the logic gates 231 and 232 can include different types of logic gates having different calculation.

In some embodiments, when the address of the word line $Add_{CBR}$ is represented in hexadecimal sequence of 4 bits, the part of the address of the word line $Add_{CBR}$, which is input to the random number generator 23, can be 2 bits, i.e., a half of the total bit length. In other embodiments, the part of the address of the word line $Add_{CBR}$ can be the last 2 bits irrespective of the total bit length. In some embodiments, the address of the word line $Add_{CBR}$ in hexadecimal can be converted to binary. In some embodiments, the 2 bits in hexadecimal of the address of the word line $Add_{CBR}$ can be converted to 8 bits in binary.

In some embodiments, when the address of the accessed word line $Add_{LRH}$ is represented in hexadecimal sequence of 4 bits, the part of the address of the accessed word line $Add_{LRH}$, which is input to the random number generator 23, can be 2 bits, i.e., a half of the total bit length. In other embodiments, the part of the address of the accessed word line $Add_{LRH}$ can be the last 2 bits irrespective of the total bit length. In some embodiments, the address of the accessed word line $Add_{LRH}$ in hexadecimal can be converted to binary. In some embodiments, the 2 bits in hexadecimal of the address of the accessed word line $Add_{LRH}$ can be converted to 8 bits in binary.

The part of the word line $Add_{CBR}$ and the part of the accessed word line $Add_{LRH}$, inputted to the random number generator 23 (such as the logic gates 231 and 232), can have the same bit length. In some embodiments, the bits of the word line $Add_{CBR}$ and the bits of the accessed word line $Add_{LRH}$, inputted to the random number generator 23, can be determined according to the size of the memory array.

In some embodiments, the switch 235 can be electrically coupled to the logic gates 231 and 232. The switch 235 can be connected to the output terminal of the logic gate 231. The switch 235 can be connected to the output terminal of the logic gate 232. That is, the switch 235 can be configured to receive the first output S231 and the second output S232.

In some embodiments, the switch 235 can be configured to select one of the first output S231 and the second output S232 to be the first number 23A, i.e., the output of the random number generator 23. In some embodiments, the first number 23A is selected from the first output S231 and the second output S232, and thus unpredictability can be increased.

In some embodiments, the switch 235 is configured to select between the first output S231 and the second output S232 in response to a selection signal S0. In some embodiments, the switch 235 can be a multiplexer (MUX). For example, the switch 235 can be a 2-to-1 multiplexer. In other embodiments, the switch 235 can be other suitable elements.

In some embodiments, in each refresh cycle, the switch 235 can be configured to select in sequence the first output S231 and the second output S232 to be the first number 23A in response to the selection signal S0. In another embodiment, in each refresh cycle, the switch 235 can be configured to randomly select the first output S231 and the second output S232 to be the first number 23A in response to the selection signal S0. In some embodiments, the selection signal S0 may be generated by the controller 22 based on a clock signal. In another embodiment, the switch 235 may receive the selection signal S0 from other elements (not shown).

In some embodiments, the random number generator 23 can be coupled to the counter 24. The random number generator 23 can be connected to the counter 24 through the number trimmer 26. In another embodiment, the random number generator 23 can be connected to the counter 24 bypass the number trimmer 26 (not shown).

The random number generator 23 can be configured to generate a random number (i.e., the first number 23A) in response to the address of the word line $Add_{CBR}$ and the address of the accessed word line $Add_{LRH}$. Although the word line $Add_{CBR}$ may be predetermined according to the refresh pattern, the accessed word line $Add_{LRH}$ can be randomly chosen from the memory array. Therefore, the first number 23A can be harder to predict. Accordingly, the security of the memory device 2 can be improved.

The number trimmer 26 can be connected to the random number generator 23 and configured to receive the first number 23A. The number trimmer 26 can be a circuit decreasing the first number 23A to less than a threshold. In some embodiments, the number trimmer 26 can be configured to generate a modified first number 23B (or a second number 23B) according to the first number 23A. In some embodiments, the first number 23A can be modified by the number trimmer 26 to the modified first number 23B when the first number 23A is greater than a first predetermined number. In some embodiments, the first predetermined number is the maximum accessing number between refresh cycles (detailed description thereof can be found in FIG. 3). After modification, the modified first number 23B is less than the first predetermined number. The modified first number 23B can be less than the first number 23A.

Figure 2A:
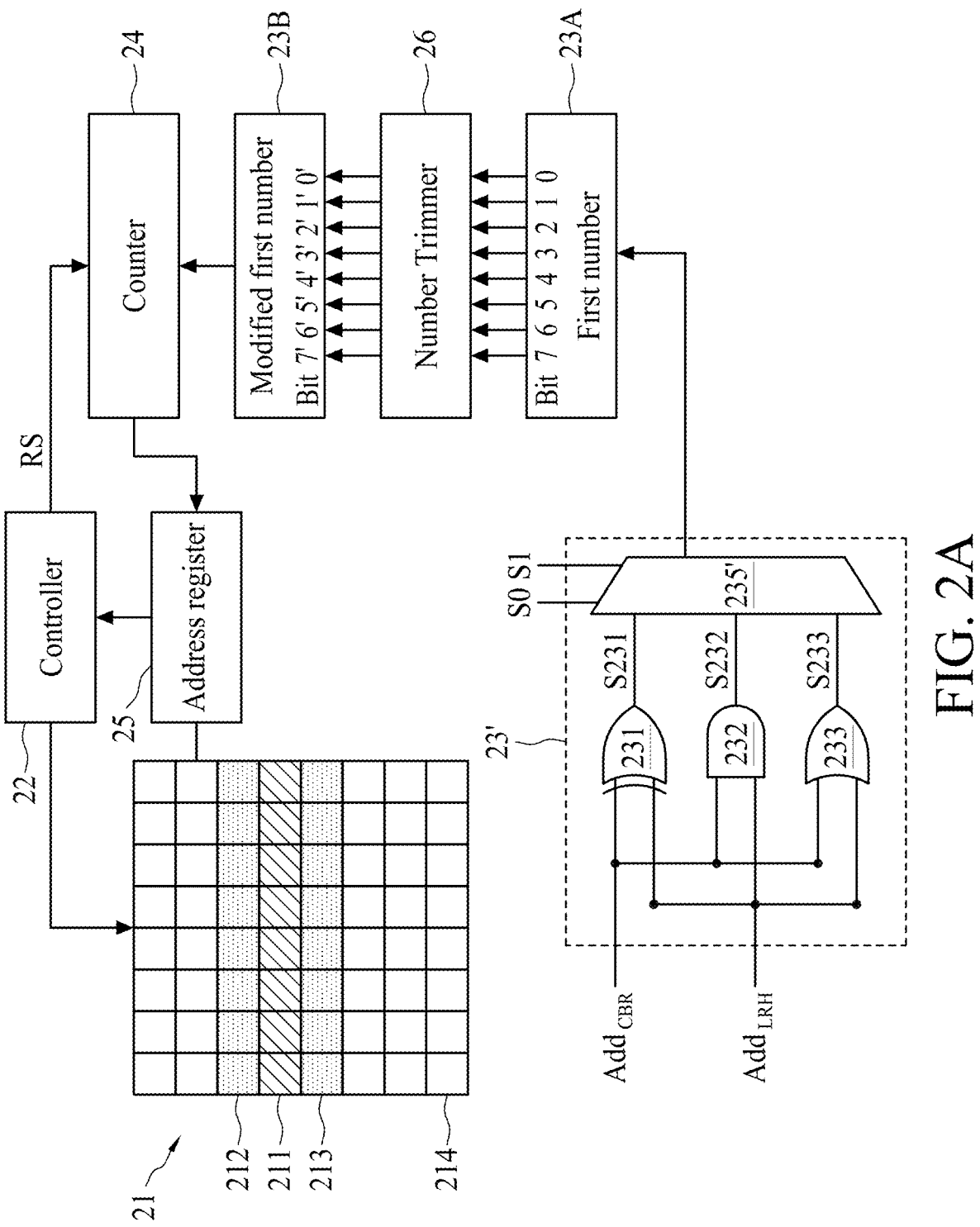
FIG. 2A is a schematic diagram of a memory device, in accordance with some embodiments of the present disclosure.
Figure 2B:
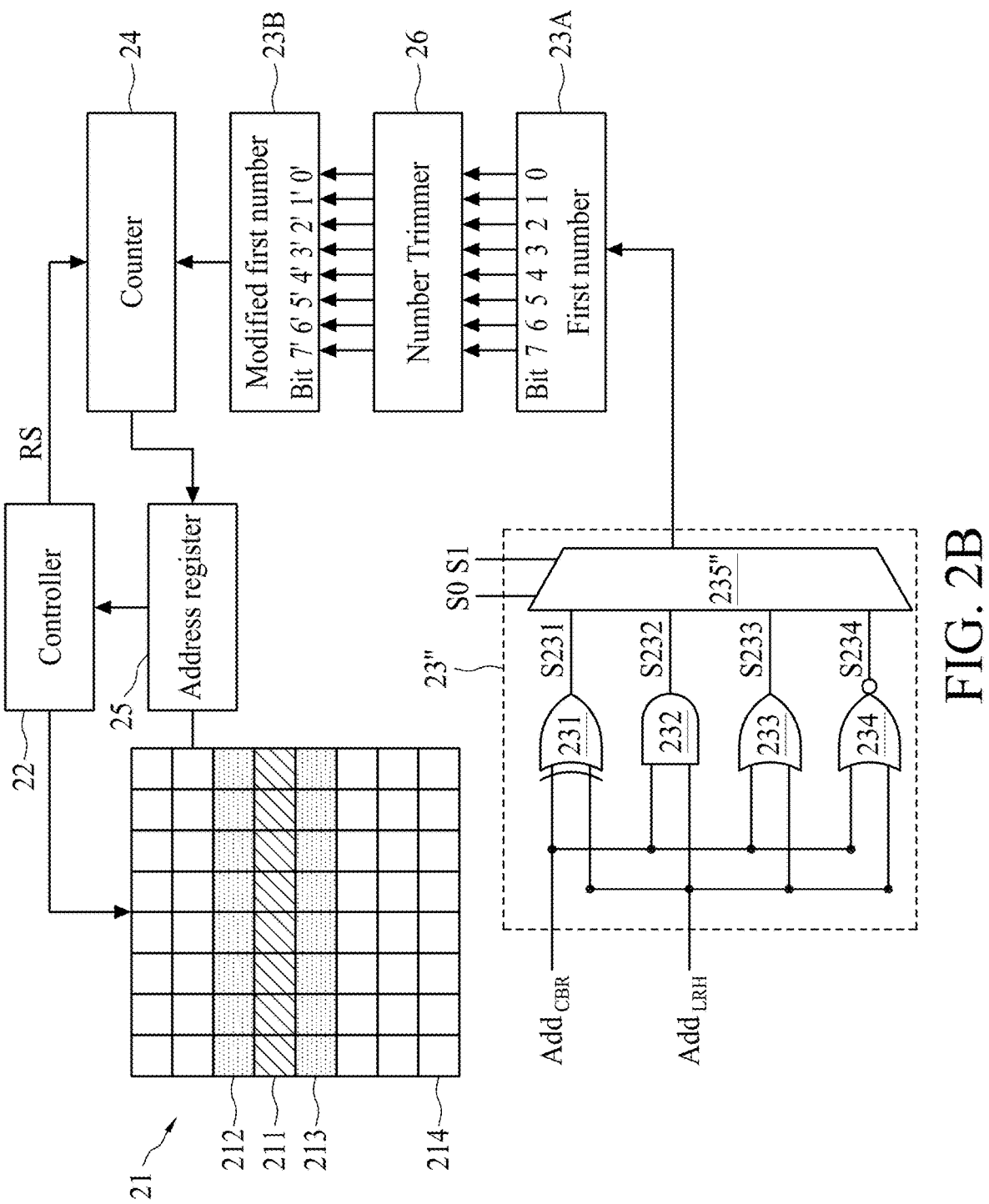
FIG. 2B is a schematic diagram of a memory device, in accordance with some embodiments of the present disclosure.

Before the memory devices 2A and 2B shown in FIGS. 2A and 2B to be discussed, the operations performed by the memory device 2 during refresh cycles will be elaborated in accordance with FIGS. 3, 3A, 3B, and 3C.

Figure 3:
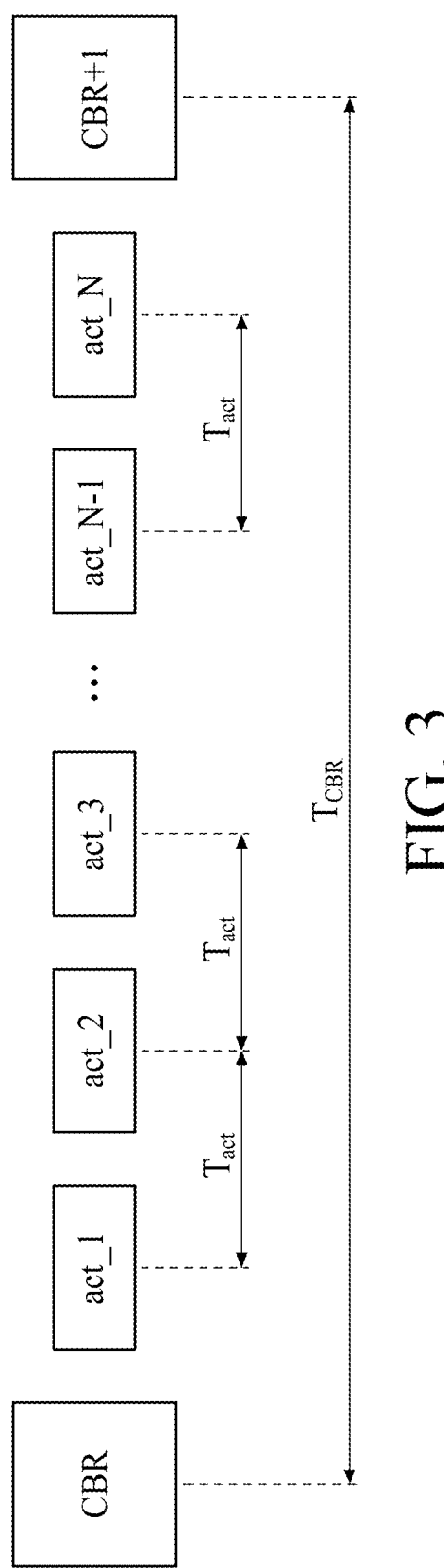
FIG. 3 is a schematic diagram illustrating activation of word lines between refresh cycles along a timeline, in accordance with some embodiments of the present disclosure.

FIG. 3 is a schematic diagram 3 illustrating activation of word lines between refresh cycles along a timeline, in accordance with some embodiments of the present disclosure.

Referring to FIG. 3, along the timeline (i.e., the x-axis), a time period $T_{CBR}$ is between a first refresh cycle CBR and a second refresh cycle CBR+1. In some embodiments, the second refresh cycle CBR+1 is next to the first refresh cycle CBR. In some embodiments, each of the first refresh cycle CBR and the second refresh cycle CBR+1 may include a period for refreshing operation and also an idle period. The idle period mentioned here refers to the waiting time between the beginning of the refresh cycle CBR till the beginning of the refresh cycle CBR+1. Accordingly, the time period $T_{CBR}$ may be from the starting point of the first refresh cycle CBR to the starting point of the second refresh cycle CBR+1.

In some embodiments, a number N of activations (act_1, act_2, act_3, . . . , act_N−1, act_N) occurs between the first refresh cycle CBR and the second refresh cycle CBR+1. Each activation act_1, act_2, act_3, act_N−1, and act_N represent an access to a word line. The time period $T_{act}$ is between two activations. For example, the time period $T_{act}$ can be between the activations act_1 and act_2. In some embodiments, the time period $T_{act}$ can be the minimum essential time for accessing a word line (such as the first activation act_1).

To clearly elaborate the present disclosure, a memory array having 8 k of word lines is used as an example. The memory array can include 8192 word lines. The address of the word lines may be represented by a hexadecimal sequence, such as with 4 bits. In some embodiments, the time for refreshing all word lines (i.e., 8192 word lines) can be 64 ms. In such a case, the time period $T_{CBR}$, which is the time needed to refresh one word line, can be calculated as 64 ms/8192, and thus the time period $T_{CBR}$ would be 7.8125 μs. In other words, the time period $T_{CBR}$, from the starting point of the first refresh cycle to the starting point of the second refresh cycle, can be 7.8125 μs for a total 8 k word lines. Assuming the time period $T_{act}$ of 45.75 ns, the maximum accessing number $N_{m}ax$ between refresh cycles can be calculated according to the equation $$N_{max} = \frac{T_{CBR}}{T_{act}}.$$

Therefore, the maximum accessing number $N_{max}$ can be 7.8125 μs/45.75 ns=170.765≈170, which means the number N in FIG. 3 is 170. There can be 170 word lines accessed between refresh cycles in this embodiment. Accordingly, the first number 23A received by the counter 24 can be modulated to under a predetermined number (for example, 170 in this embodiment).

In some embodiments, the first number 23A can be less than a predetermined number, which is associated with the time period $T_{act}$ for accessing a word line and the time period $T_{CBR}$ between the first refresh cycle CBR and the second refresh cycle CBR+1. In some embodiments, the counter 24 can be configured to reset the initial value when the first number 23A is greater than the predetermined number. For example, the initial value of the counter 24 can be reset to zero or to a constant less than the predetermined number. Accordingly, the counter 24 can start counting down from the initial value that is in a range of 0 to the predetermined number (i.e., the maximum accessing number between refresh cycles), and when decrementing to zero, a word line can be selected to be protected during the subsequent refresh cycle.

Referring again to FIG. 2, the modified first number 23B can be represented in a form identical to that of the first number 23A. In some embodiments, the first number and the modified number can both be binary. For example, if the first number 23A is represented by a binary sequence having 8 bits, the modified first number 23B is also represented by a binary sequence having 8 bits. In some embodiments, the first number 23A can be represented in a binary sequence having Bit7, Bit6, Bit5, Bit4, Bit3, Bit2, Bit1, and Bit0. The modified first number 23B can be represented in a binary sequence having Bit7', Bit6', Bit5', Bit4', Bit3', Bit2', Bit1', and Bit0'.

The difference between the first number 23A and the modified first number 23B can be one bit of the binary sequence. For example, a most significant bit (msb) of the first number 23A can be different from that of the modified first number 23B. That is, Bit7' of the modified first number 23B is different from Bit7 of the first number 23A. In some embodiments, Bit6' to Bit0' of the modified first number 23B can be identical to Bit6 to Bit0 of the first number 23A. In another embodiment, the modified first number 23B can be reset to zero by the number trimmer 26. Accordingly, Bit7' to Bit0' of the modified first number 23B are logic "0".

On the contrary, when the first number 23A is less than the first predetermined number, the number trimmer 26 will take no action on the first number 23A. In such a case, the modified first number 23B would be identical to the original first number 23A.

The counter 24 can be electrically coupled to the random number generator 23 and the number trimmer 26. In some embodiments, the counter 24 can be electrically coupled to the random number generator 23 through the number trimmer 26. The counter 24 can be configured to receive the modified first number 23B as an initial value of the counter 24. That is, the counter 24 can count down from the initial value, i.e., the modified first number 23B. In one embodiment, when the first number 23A is less than the first predetermined number, the modified first number 23B is identical to the first number 23A, and the counter 24 decrements from the modified first number 23B (i.e., the first number 23A). In another embodiment, when the first number 23A is greater than the first predetermined number, the first number 23A is modified to the modified first number 23B, which is less than the first predetermined number, and the counter 24 decrements from the modified first number 23B, which is different from the first number 23A.

In some embodiments, the counter 24 is configured to be turned on in response to the refresh signal RS received from the controller 22. In other words, the counter 24 can be configured to start counting down in response to the refresh signal RS. The counter 24 can be configured to decrement from the initial value, i.e., the first number 23A or the modified first number 23B.

In some embodiments, the counter 24 can be configured to decrement in response to an accessing signal, indicative of an access to one of the word lines.

The address register 25 can be electrically coupled to the counter 24. The address register 25 can be configured to obtain an address of a first word line 211 (or the possible target word line 211) that is active when the counter 24 decrements to zero, and store the address.

Figure 3A:
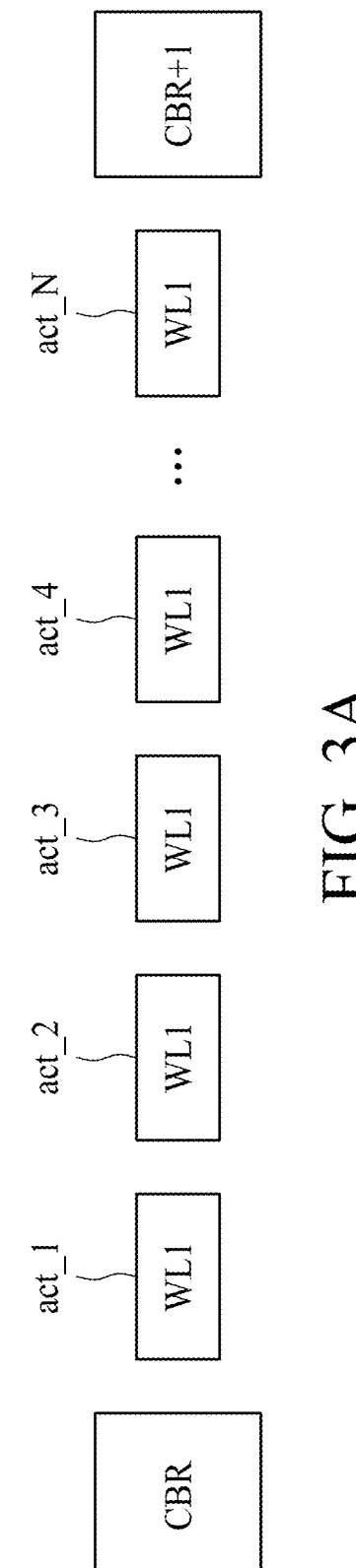
FIG. 3A is a schematic diagram illustrating accessed word line address at each activation between refresh cycles along a timeline, in accordance with some embodiments of the present disclosure.

FIG. 3A is a schematic diagram 3A illustrating accessed word line address at each activation between refresh cycles CBR and CBR+1 along a timeline, in accordance with some embodiments of the present disclosure.

Referring to FIG. 3A, the word line address WL1 is accessed at every activations act_1, act_2, act_3, act_4, . . . , and act_N. In such a case, irrespective of the initial value of the counter 24, the address register 25 stores the word line address WL1, which is accessed the most. In other words, the word line address WL1 can be the most possible target of the malicious operator. Therefore, selecting the word lines adjacent to the word line address WL1 to be protected can prevent row hammer.

Figure 3B:
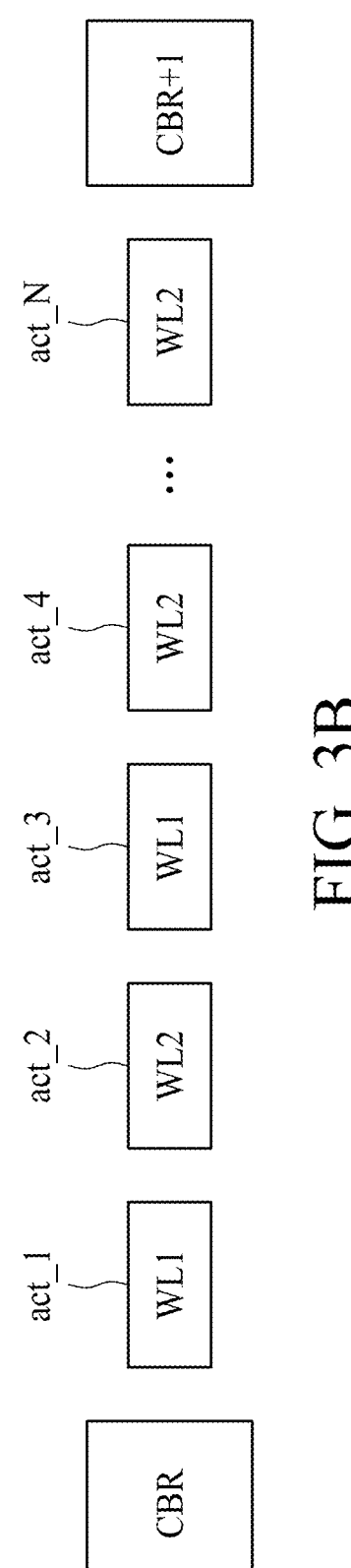
FIG. 3B is a schematic diagram illustrating accessed word line address at each activation between refresh cycles along a timeline, in accordance with some embodiments of the present disclosure.

FIG. 3B is a schematic diagram 3B illustrating accessed word line address at each activation between refresh cycles CBR and CBR+1 along a timeline, in accordance with some embodiments of the present disclosure.

Referring to FIG. 3B, the word line address WL1 is accessed at the activation act_1. The word line address WL2 is accessed at the activation act_2. The word line address WL1 is accessed at the activation act_3. The word line address WL2 is accessed at the activation act_4. The word line address WL2 is accessed at the activation act_N. That is, only word line addresses WL1 and WL2 are accessed. In such a case, irrespective of the initial value of the counter 24, the address register 25 stores either the word line address WL1 or WL2, which are accessed the most. In some embodiments, the attacked possibility of the word line addresses WL1 and WL2 are both 50%. In other words, the word line addresses WL1 and WL2 can be the most possible target of the attacker. Therefore, selecting the word lines adjacent to the word line address WL1 or WL2 to be protected can prevent row hammer.

Figure 3C:
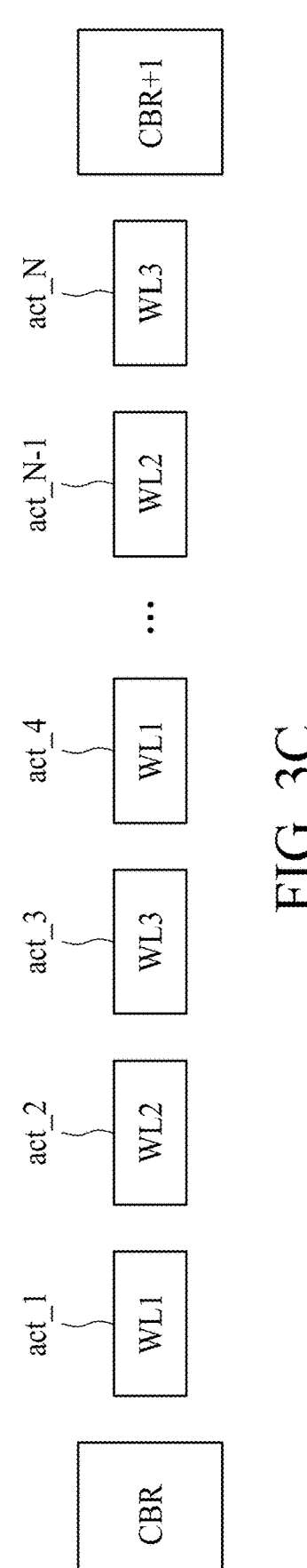
FIG. 3C is a schematic diagram illustrating accessed word line address at each activation between refresh cycles along a timeline, in accordance with some embodiments of the present disclosure.

FIG. 3C is a schematic diagram 3C illustrating accessed word line address at each activation between refresh cycles CBR and CBR+1 along a timeline, in accordance with some embodiments of the present disclosure.

Referring to FIG. 3C, the word line address WL1 is accessed at the activation act_1. The word line address WL2 is accessed at the activation act_2. The word line address WL3 is accessed at the activation act_3. The word line address WL1 is accessed at the activation act_4. The word line address WL2 is accessed at the activation act_N−1. The word line address WL3 is accessed at the activation act_N. In some embodiments, the word line addresses WL1, WL2, and WL3 are accessed in sequence repeatedly. That is, only word line addresses WL1, WL2, and WL3 are accessed between refresh cycles. In such a case, the address register 25 stores one of the word line addresses WL1, WL2, and WL3. In some embodiments, the attacked possibility of the word line addresses WL1, WL2, and WL3 may be about 33.33%. In other words, the word line addresses WL1, WL2, and WL3 can be the most possible target of the malicious operator. Therefore, selecting the word lines adjacent to the word line address WL1, WL2, or WL3 to be protected can prevent row hammer.

Referring to FIGS. 3A-3C, the address of the word line to be protected can be randomly selected from those word lines active during two refresh cycles. The word line is selected from those activated between refresh cycles. In such a case, the selection pool includes the word lines activated between refresh cycles.

Referring back to FIG. 2, the controller 22 can be configured to access the address register 25 to obtain the address of the first word line and protect a second word line 212/213 (i.e., the adjacent word line 212 or 213) during a second refresh cycle. To protect the second word line 212/213, the controller can be configured to refresh the second word line 212/213 during the second refresh cycle in response to the refresh signal RS. In some embodiments, the second refresh cycle follows the first refresh cycle. For example, the second refresh cycle can be the subsequent refresh cycle of the first refresh cycle. In some embodiments, the second word line 212/213 is adjacent to the first word line 211.

The controller 22 can be configured to refresh one or more word lines during one refresh cycle. In some embodiments, the controller 22 can be configured to refresh one, two, three, four, or more word lines at the same time. The controller 22 can be configured to refresh both adjacent word lines 212 and 213 during the same refresh cycle. In some embodiments, in addition to the second word line 212/213, the controller 22 can be configured to refresh a third word line 214 during the second refresh cycle in response to the refresh signal RS, where the address of the third word line 214 is separate from the address of the first word line 211.

In some embodiments, the controller 22 can be configured to refresh one word line adjacent to the possible target word line 211 and another word line separate from the possible target word line 211. For example, the word line 212 and the word line 214 can be refreshed during the second refresh cycle. In some embodiments, in one refresh cycle, the controller 22 can be configured to refresh one normal word line (such as the word line 214) according to the predetermined refresh pattern and one high risk word line (such as the word line 212 or 213), which are determined by the random number generator 23 and the counter 24. That is, at least one normal refresh word line and at least one word line having high risk of row hammer effect can be refreshed in one refresh cycle simultaneously.

In the present disclosure, the address of the first word line 211 (or the possible target word line 211) that is active can be obtained when the counter 24 decrements to zero. In such case, the address of the word line to be protected can be randomly selected from those word lines active during two refresh cycles. In addition, the number trimmer 26 modifies the first number 23A to a range from zero to the first predetermined number, to avoid the first number 23A exceeding the maximum number of activations between refresh cycles.

FIG. 2A is a schematic diagram of a memory device 2A, in accordance with some embodiments of the present disclosure. The memory device 2A of FIG. 2A is similar to the memory device 2 of FIG. 2, except that the memory device 2A of FIG. 2A includes a random number generator 23' including three logic gates 231, 232, and 233.

Referring to FIG. 2A, the random number generator 23' can include logic gates 231, 232, and 233, and a switch 235'. In some embodiments, the logic gates 231, 232, and 233 can include different types of logic gates. The logic gates 231, 232, and 233 can include OR gates, AND gates, NOR gates, NAND gates, XOR gates, XNOR gates and so on. For example, the logic gate 231 can be a XOR gate. The logic gate can be an AND gate. The logic gate 233 can be an OR gate.

The arrangement of the logic gates 231 and 232 in FIG. 2A is similar to that in FIG. 2. In some embodiments, the logic gate 233 can have a first input terminal receiving the address of the word line $Add_{CBR}$, a second input terminal receiving the address of the accessed word line $Add_{LRH}$, and an output terminal outputting a third output S233. The logic gate 233 can be configured to generate the third output S233 according to the address of the word line $Add_{CBR}$ and the address of the accessed word line $Add_{LRH}$. In some embodiments, the logic gate 233 can be configured to generate the third output S233 according to a part of the address of the word line $Add_{CBR}$ and a part of the address of the accessed word line $Add_{LRH}$. In some embodiments, the operation of the logic gate 233 can be similar to that of the logic gate 231 or 232.

In some embodiments, the first input terminal of the logic gate 231, the first input terminal of the logic gate 232, and the first input terminal of the logic gate 233 can be connected, so as to receive the address of the word line $Add_{CBR}$. The second input terminal of the logic gate 231, the second input terminal of the logic gate 232, and the second input terminal of the logic gate 233 can be connected, so as to receive the address of the accessed word line $Add_{LRH}$.

Although the logic gates 231, 232, and 233 receive the same inputs, i.e., the address of the word line $Add_{CBR}$ and the address of the accessed word line $Add_{LRH}$, the first output S321, the second output S322, and the third output S233 can be different due to different types of logic gates having different calculation.

In some embodiments, the switch 235' can be electrically coupled to the logic gates 231, 232, and 233. The switch 235' can be connected to the output terminals of the logic gates 231, 232, and 233. That is, the switch 235' can be configured to receive the first output S231, the second output S232, and the third output S233. In some embodiments, the switch 235' can be configured to select one of the first output S231, the second output S232, and the third output S233 to be the first number 23A, i.e., the output of the random number generator 23. In some embodiments, the first number 23A is selected among the first output S231, the second output S232, and the third output S233, increasing unpredictability.

In some embodiments, the switch 235' is configured to select among the first output S231, the second output S232, and the third output S233 in response to a selection signals S0 and S1. In some embodiments, the switch 235' can be a multiplexer (MUX). For example, the switch 235' can be a 3-to-1 multiplexer or a 4-to-1 multiplexer. In other embodiments, the switch 235 can be other suitable elements.

In some embodiments, in each refresh cycle, the switch 235' can be configured to select in sequence the first output S231, the second output S232, and the third output S233 to be the first number 23A in response to the selection signals S0 and S1. In another embodiment, in each refresh cycle, the switch 235' can be configured to randomly select the first output S231, the second output S232, and the third output S233 to be the first number 23A in response to the selection signals S0 and S1. In some embodiments, the selection signals S0 and S1 may be generated by the controller 22 based on a clock signal. In another embodiment, the switch 235' may receive the selection signals S0 and S1 from other elements (not shown).

FIG. 2B is a schematic diagram of a memory device 2B, in accordance with some embodiments of the present disclosure. The memory device 2B of FIG. 2B is similar to the memory device 2A of FIG. 2A, except that the memory device 2B of FIG. 2B includes a random number generator 23" including four logic gates 231, 232, 233, and 234.

Referring to FIG. 2B, the random number generator 23" can include logic gates 231, 232, 233, and 234, and a switch 235". In some embodiments, the logic gates 231, 232, 233, and 234 can include different types of logic gates. The logic gates 231, 232, 233, and 234 can include OR gates, AND gates, NOR gates, NAND gates, XOR gates, XNOR gates and so on. For example, the logic gate 231 can be a XOR gate. The logic gate can be an AND gate. The logic gate 233 can be an OR gate. The logic gate 234 can be a NOR gate.

The arrangement of the logic gates 231, 232, and 233 in FIG. 2B is similar to that in FIG. 2A. In some embodiments, the logic gate 234 can have a first input terminal receiving the address of the word line $Add_{CBR}$, a second input terminal receiving the address of the accessed word line $Add_{LRH}$, and an output terminal outputting a third output S234. The logic gate 234 can be configured to generate the third output S234 according to the address of the word line $Add_{CBR}$ and the address of the accessed word line $Add_{LRH}$. In some embodiments, the logic gate 234 can be configured to generate the fourth output S234 according to a part of the address of the word line $Add_{CBR}$ and a part of the address of the accessed word line $Add_{LRH}$. In some embodiments, the operation of the logic gate 234 can be similar to that of the logic gate 231, 232, or 233.

In some embodiments, the first input terminal of the logic gate 231, the first input terminal of the logic gate 232, the first input terminal of the logic gate 233, and the first input terminal of the logic gate 234 can be connected, so as to receive the address of the word line $Add_{CBR}$. The second input terminal of the logic gate 231, the second input terminal of the logic gate 232, the second input terminal of the logic gate 233, and the second input terminal of the logic gate 234 can be connected, so as to receive the address of the accessed word line $Add_{LRH}$.

Although the logic gates 231, 232, 233, and 234 receive the same inputs, i.e., the address of the word line $Add_{CBR}$ and the address of the accessed word line $Add_{LRH}$, the first output S321, the second output S322, the third output S233, and the fourth output S234 can be different due to different types of logic gates having different calculation.

In some embodiments, the switch 235" can be electrically coupled to the logic gates 231, 232, 233, and 234. The switch 235" can be connected to the output terminals of the logic gates 231, 232, 233, and 234. That is, the switch 235" can be configured to receive the first output S231, the second output S232, the third output S233, and the fourth output S234. In some embodiments, the switch 235" can be configured to select one of the first output S231, the second output S232, the third output S233, and the fourth output S234 to be the first number 23A, i.e., the output of the random number generator 23. In some embodiments, the first number 23A is selected among the first output S231, the second output S232, the third output S233, and the fourth output S234, increasing unpredictability thereof.

In some embodiments, the switch 235" is configured to select among the first output S231, the second output S232, the third output S233, and the fourth output S234 in response to selection signals S0 and S1. In some embodiments, the switch 235" can be a multiplexer (MUX). For example, the switch 235" can be a 4-to-1 multiplexer. In other embodiments, the switch 235 can be other suitable elements.

In some embodiments, in each refresh cycle, the switch 235" can be configured to select in sequence the first output S231, the second output S232, the third output S233, and the fourth output S234 to be the first number 23A in response to the selection signals S0 and S1. In another embodiment, in each refresh cycle, the switch 235" can be configured to randomly select the first output S231, the second output S232, the third output S233, and the fourth output S234 to be the first number 23A in response to the selection signals S0 and S1. In some embodiments, the selection signals S0 and S1 may be generated by the controller 22 based on a clock signal. In another embodiment, the switch 235" may receive the selection signals S0 and S1 from other elements (not shown).

FIGS. 4A-4D show an exemplary situation in which the switch 235" of the random number generator 23" of the memory device 2B in FIG. 2B, in each refresh cycle, selects the first output S231, the second output S232, the third output S233, and the fourth output S234 in sequence, in accordance with some embodiments of the present disclosure.

Figure 4A:
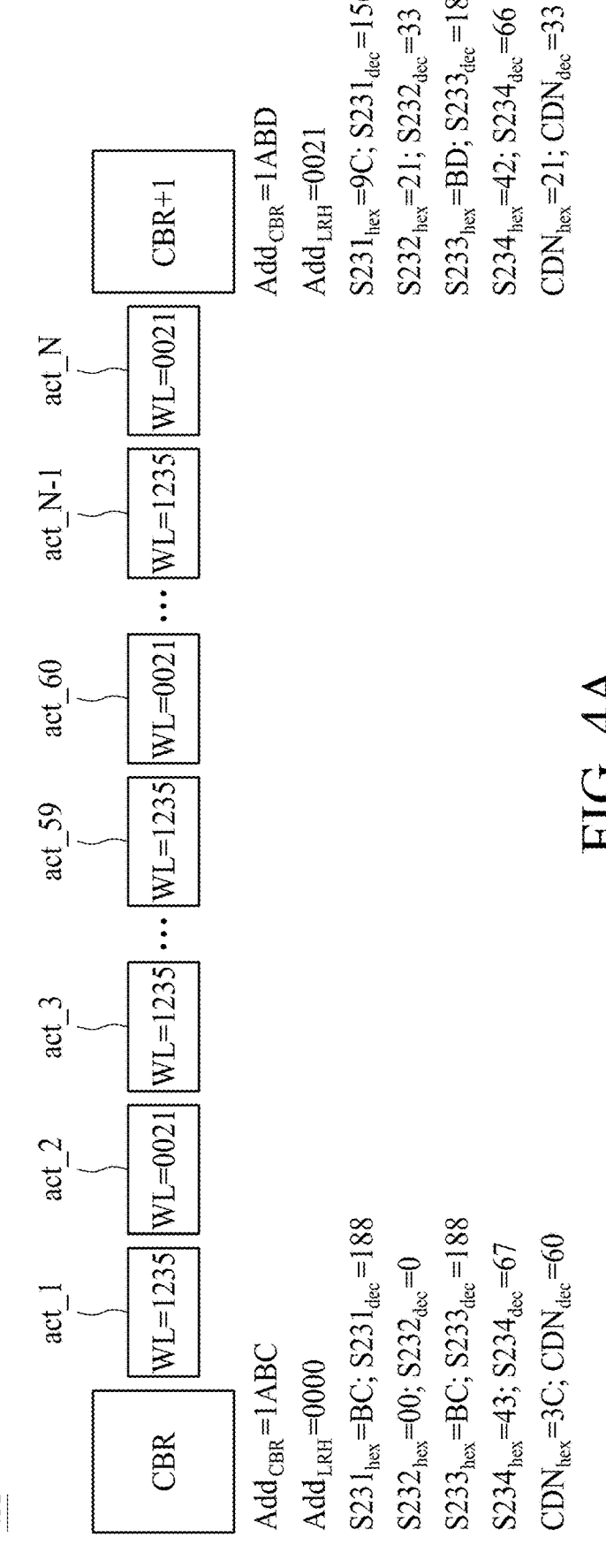
FIG. 4A is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4A is a schematic diagram 4A illustrating accessed word line address between refresh cycles CBR and CBR+1 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4A, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_59. The word line address WL of 0021 is accessed at the activation act_60. The word line address WL of 1235 is accessed at the activation act_N−1. The word line address WL of 0021 is accessed at the activation act_N. That is, only two word line addresses 1235 and 0021 are accessed. In some embodiments, the word line addresses in FIG. 4A are represented by a hexadecimal sequence having 4 bits. In other words, the word line address WL of 1235 in hexadecimal can be equivalent to 4661 in decimal, and to 0001001000110101 in binary. The word line address WL of 0021 in hexadecimal can be equivalent to 33 in decimal, and to 0000000000100001 in binary.

In the refresh cycle CBR, the refresh word line address $Add_{CBR}$ can be, for example, 1ABC. When the refresh cycle CBR is the initial refresh cycle, there is no previous refresh cycle and thus the possible target row hammer word line located address $Add_{LRH}$ (in the previous refresh cycle) can be 0000. The word line address WL of 1ABC in hexadecimal can be equivalent to 6844 in decimal, and to 0001101010111100. As discussed in FIG. 2B, the random number generator 23" can be configured to generate the first number 23A in response to the last 2 bits of the refresh word line address $Add_{CBR}$ and the row hammer target word line address $Add_{LRH}$ in hexadecimal.

In response to the last 2 bits of the refresh word line address $Add_{CBR}$ being BC and the last 2 bits of the row hammer target word line address $Add_{LRH}$ being 00, the first output $S321_{hex}$ can be BC according to the operation of the logic gate 231 (such as, XOR). In some embodiments, the first output $S321_{hex}$=BC can be equivalent to the first output $S321_{dec}$=188.

In response to the last 2 bits of the refresh word line address $Add_{CBR}$ being BC and the last 2 bits of the row hammer target word line address $Add_{LRH}$ being 00, the second output $S322_{hex}$ can be 00 according to the operation of the logic gate 232 (such as, AND). In some embodiments, the second output $S322_{hex}$=00 can be equivalent to the second output $S322_{dec}$=0.

In response to the last 2 bits of the refresh word line address $Add_{CBR}$ being BC and the last 2 bits of the row hammer target word line address $Add_{LRH}$ being 00, the third output $S323_{hex}$ can be BC according to the operation of the logic gate 233 (such as, OR). In some embodiments, the third output $S323_{hex}$=BC can be equivalent to the third output $S323_{dec}$=188.

In response to the last 2 bits of the refresh word line address $Add_{CBR}$ being BC and the last 2 bits of the row hammer target word line address $Add_{LRH}$ being 00, the fourth output $S324_{hex}$ can be 43 according to the operation of the logic gate 234 (such as, NOR). In some embodiments, the fourth output $S324_{hex}$=43 can be equivalent to the fourth output $S324_{dec}$=67.

For the first refresh cycle CBR, the switch 235" may select the first output S321 to be the first number 23A. The first number 23A can be BC in hexadecimal (188 in decimal), and thus exceeds the first predetermined number (for example, 171 in decimal). After the operation of the number trimmer 26, the first number 23A can be reset to zero to become the modified first number 23B input to the counter 24. Accordingly, the initial countdown number $CDN_{hex}$ (the initial number of the counter 24), i.e., the modified first number 23B, can be 3C in hexadecimal. In some embodiments, the initial countdown number $CDN_{hex}$=3C can be equivalent to initial countdown number $CDN_{dec}$=60. In such a case, the counter 24 can count down from 60, and the address register 25 can be configured to obtain the word line address accessed at the activation act_60 between the refresh cycles CBR and CBR+1, i.e., WL of 0021. Accordingly, in the subsequent refresh cycle CBR+1, the row hammer target word line address $Add_{LRH}$ will be 0021. That is, the adjacent word lines of 0021 (such as the word line addresses 0020 or 0022) can be protected in the refresh cycle CBR+1.

In the refresh cycle CBR+1, the refresh word line address $Add_{CBR}$ can be 1ABD, and the row hammer target word line address $Add_{LRH}$ can be 0021. The word line address WL of 1ABD in hexadecimal can be equivalent to 6845 in decimal, and to 0001101010111101.

In response to the last 2 bits of the refresh word line address $Add_{CBR}$ being BD and the last 2 bits of the row hammer target word line address $Add_{LRH}$ being 21, the first output $S321_{hex}$ can be 9C according to the operation of the logic gate 231 (such as, XOR). In some embodiments, the first output $S321_{hex}$=9C can be equivalent to the first output $S321_{dec}$=156.

In response to the last 2 bits of the refresh word line address $Add_{CBR}$ being BD and the last 2 bits of the row hammer target word line address $Add_{LRH}$ being 21, the second output $S322_{hex}$ can be 21 according to the operation of the logic gate 232 (such as, AND). In some embodiments, the second output $S322_{hex}$=21 can be equivalent to the second output $S322_{dec}$=33.

In response to the last 2 bits of the refresh word line address $Add_{CBR}$ being BD and the last 2 bits of the row hammer target word line address $Add_{LRH}$ being 21, the third output $S323_{hex}$ can be BD according to the operation of the logic gate 233 (such as, OR). In some embodiments, the third output $S323_{hex}$=BD can be equivalent to the third output $S323_{dec}$=189.

In response to the last 2 bits of the refresh word line address $Add_{CBR}$ being BD and the last 2 bits of the row hammer target word line address $Add_{LRH}$ being 21, the fourth output $S324_{hex}$ can be 42 according to the operation of the logic gate 234 (such as, NOR). In some embodiments, the fourth output $S324_{hex}$=42 can be equivalent to the fourth output $S324_{dec}$=66.

For the second refresh cycle CBR+1, the switch 235" may select the second output S322 to be the first number 23A. The first number 23A can be 21 in hexadecimal (33 in decimal), and thus is less than the first predetermined number (for example, 171 in decimal). Without triggering operation of the number trimmer 26, the first number 23A can be identical to the modified first number 23B for input to the counter 24. Accordingly, the initial countdown number $CDN_{hex}$ (the initial number of the counter 24), i.e., the modified first number 23B, can be 21 in hexadecimal. In some embodiments, the initial countdown number $CDN_{hex}$=21 can be equivalent to initial countdown number $CDN_{dec}$=33. In such a case, the counter 24 can count down from 33, and the address register 25 can be configured to obtain the word line address accessed at the activation act_33 between the refresh cycles CBR+1 and CBR+2 (see FIG. 4B).

Figure 4B:
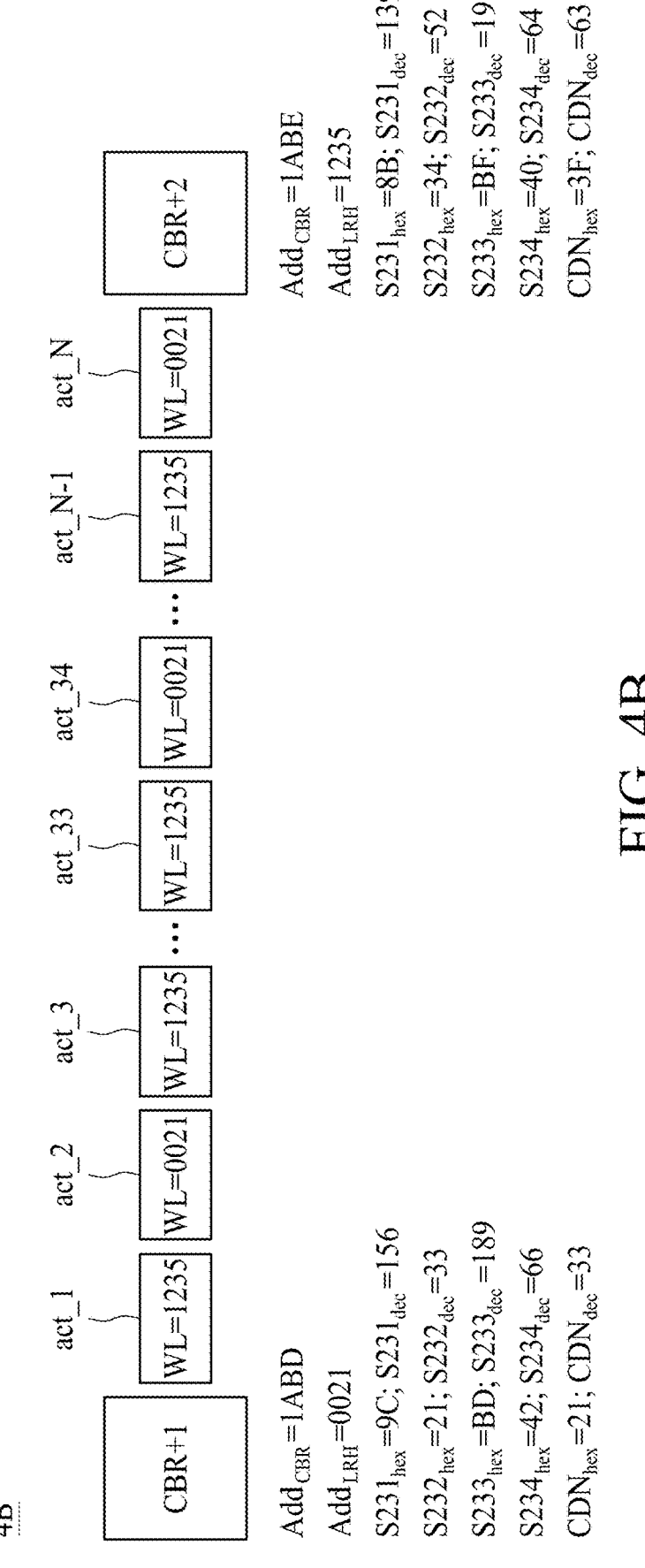
FIG. 4B is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4B is a schematic diagram 4B illustrating accessed word line address between refresh cycles CBR+1 and CBR+2 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4B, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_33. The word line address WL of 0021 is accessed at the activation act_34. The word line address WL of 1235 is accessed at the activation act_N−1. The word line address WL of 0021 is accessed at the activation act_N. That is, only two word line addresses 1235 and 0021 are accessed.

In the refresh cycle CBR+1, the refresh word line address $Add_{CBR}$ can be 1ABD, and the row hammer target word line address $Add_{LRH}$ can be 0021. As discussed in FIG. 4A, in response to the last 2 bits of the refresh word line address $Add_{CBR}$ being BD and the last 2 bits of the row hammer target word line address $Add_{LRH}$ being 21, the initial countdown number $CDN_{hex}$ can be 21 in hexadecimal in the refresh cycle CBR+1. In some embodiments, the initial countdown number $CDN_{hex}$=21 can be equivalent to initial countdown number $CDN_{dec}$=33. In such a case, the counter 24 can count down from 33, and the address register 25 can be configured to obtain the word line address accessed at the activation act_33 between the refresh cycles CBR+1 and CBR+2, i.e., WL of 1235. Accordingly, in the subsequent refresh cycle CBR+2, the row hammer target word line address $Add_{LRH}$ will be 1235. That is, the adjacent word lines of 1235 (such as the word line addresses 1234 or 1236) can be protected in the refresh cycle CBR+2.

In the refresh cycle CBR+2, the refresh word line address $Add_{CBR}$ can be 1ABE, and the row hammer target word line address $Add_{LRH}$ can be 1235. The word line address WL of 1ABE in hexadecimal can be equivalent to 6846 in decimal, and to 0001101010111110.

In response to the last 2 bits of the refresh word line address $Add_{CBR}$ being BE and the last 2 bits of the row hammer target word line address $Add_{LRH}$ being 35, the first output $S321_{hex}$ can be 8B according to the operation of the logic gate 231 (such as, XOR). In some embodiments, the first output $S321_{hex}$=8B can be equivalent to the first output $S321_{dec}$=139.

In response to the last 2 bits of the refresh word line address $Add_{CBR}$ being BE and the last 2 bits of the row hammer target word line address $Add_{LRH}$ being 35, the second output $S322_{hex}$ can be 34 according to the operation of the logic gate 232 (such as, AND). In some embodiments, the second output $S322_{hex}$=34 can be equivalent to the second output $S322_{dec}$=52.

In response to the last 2 bits of the refresh word line address $Add_{CBR}$ being BE and the last 2 bits of the row hammer target word line address $Add_{LRH}$ being 35, the third output $S323_{hex}$ can be BF according to the operation of the logic gate 233 (such as, OR). In some embodiments, the third output $S323_{hex}$=BF can be equivalent to the third output $S323_{dec}$=191.

In response to the last 2 bits of the refresh word line address $Add_{CBR}$ being BE and the last 2 bits of the row hammer target word line address $Add_{LRH}$ being 35, the fourth output $S324_{hex}$ can be 40 according to the operation of the logic gate 234 (such as, NOR). In some embodiments, the fourth output $S324_{hex}$=40 can be equivalent to the fourth output $S324_{dec}$=64.

For the third refresh cycle CBR+2, the switch 235" may select the third output S323 to be the first number 23A. The first number 23A can be BF in hexadecimal (191 in decimal), and thus exceeds the first predetermined number (for example, 171 in decimal). After the operation of the number trimmer 26, the first number 23A can be reset to zero to become the modified first number 23B input to the counter 24. Accordingly, the initial countdown number $CDN_{hex}$ (the initial number of the counter 24), i.e., the modified first number 23B, can be 3F in hexadecimal. In some embodiments, the initial countdown number $CDN_{hex}$=3F can be equivalent to initial countdown number $CDN_{dec}$=63. In such a case, the counter 24 can count down from 63, and the address register 25 can be configured to obtain the word line address accessed at the activation act_63 between the refresh cycles CBR+2 and CBR+3 (see FIG. 4C).

Figure 4C:
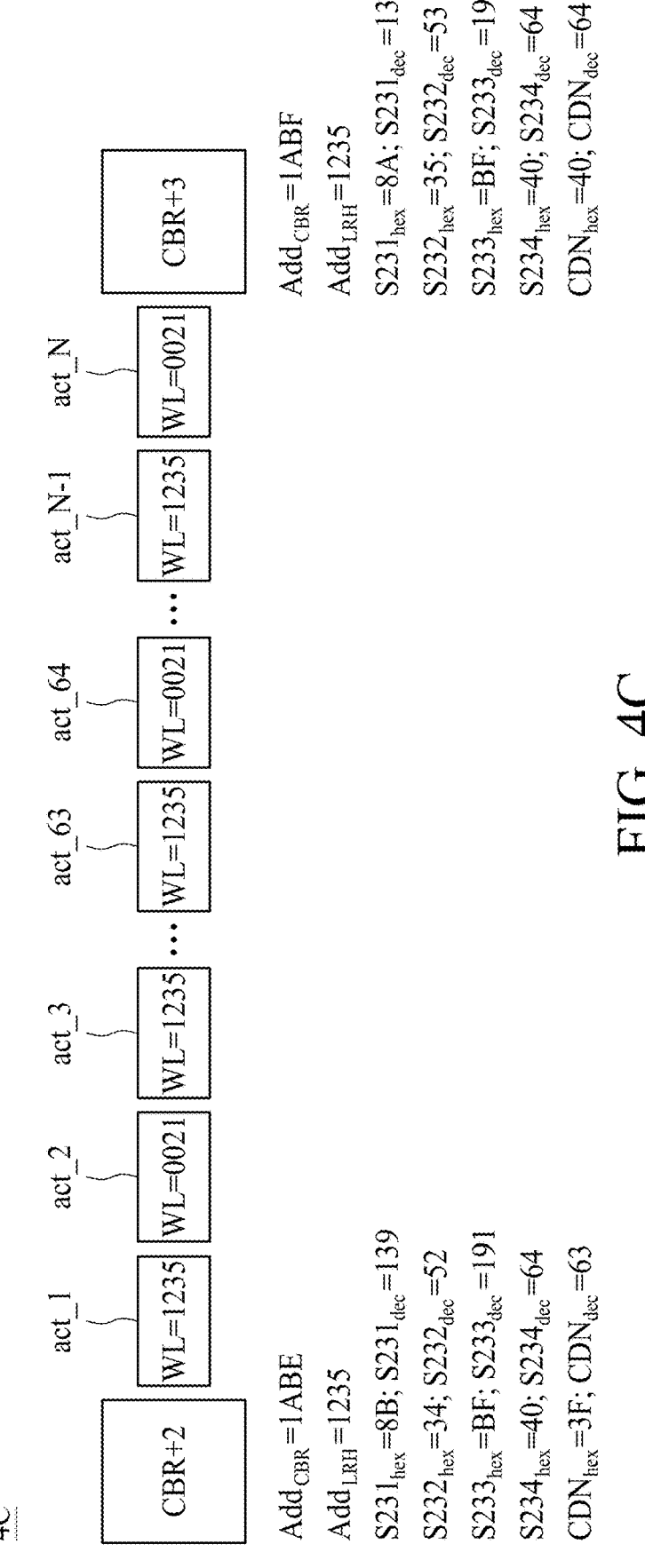
FIG. 4C is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4C is a schematic diagram 4C illustrating accessed word line address between refresh cycles CBR+2 and CBR+3 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4C, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_63. The word line address WL of 0021 is accessed at the activation act_64. The word line address WL of 1235 is accessed at the activation act_N−1. The word line address WL of 0021 is accessed at the activation act_N. That is, only two word line addresses 1235 and 0021 are accessed.

In the refresh cycle CBR+2, the refresh word line address $Add_{CBR}$ can be 1ABE, and the row hammer target word line address $Add_{LRH}$ can be 1235. As discussed in FIG. 4B, in response to the last 2 bits of the refresh word line address $Add_{CBR}$ being BE and the last 2 bits of the row hammer target word line address $Add_{LRH}$ being 35, the initial countdown number $CDN_{hex}$ can be 3F in hexadecimal in the refresh cycle CBR+2. In some embodiments, the initial countdown number $CDN_{hex}$=3F can be equivalent to initial countdown number $CDN_{dec}$=63. In such a case, the counter 24 can count down from 63, and the address register 25 can be configured to obtain the word line address accessed at the activation act_63 between the refresh cycles CBR+2 and CBR+3, i.e., WL of 1235. Accordingly, in the subsequent refresh cycle CBR+3, the row hammer target word line address $Add_{LRH}$ will also be 1235. That is, the adjacent word lines of 1235 (such as the word line addresses 1234 or 1236) can be protected in the refresh cycle CBR+3.

In the refresh cycle CBR+3, the refresh word line address $Add_{CBR}$ can be 1ABF, and the row hammer target word line address $Add_{LRH}$ can be 1235. The word line address WL of 1ABF in hexadecimal can be equivalent to 6847 in decimal, and to 0001101010111111.

In response to the last 2 bits of the refresh word line address $Add_{CBR}$ being BF and the last 2 bits of the row hammer target word line address $Add_{LRH}$ being 35, the first output $S321_{hex}$ can be 8A according to the operation of the logic gate 231 (such as, XOR). In some embodiments, the first output $S321_{hex}$=8A can be equivalent to the first output $S321_{dec}$=138.

In response to the last 2 bits of the refresh word line address $Add_{CBR}$ being BF and the last 2 bits of the row hammer target word line address $Add_{LRH}$ being 35, the second output $S322_{hex}$ can be 35 according to the operation of the logic gate 232 (such as, AND). In some embodiments, the second output $S322_{hex}$=35 can be equivalent to the second output $S322_{dec}$=53.

In response to the last 2 bits of the refresh word line address $Add_{CBR}$ being BF and the last 2 bits of the row hammer target word line address $Add_{LRH}$ being 35, the third output $S323_{hex}$ can be BF according to the operation of the logic gate 233 (such as, OR). In some embodiments, the third output $S323_{hex}$=BF can be equivalent to the third output $S323_{dec}$=191.

In response to the last 2 bits of the refresh word line address $Add_{CBR}$ being BF and the last 2 bits of the row hammer target word line address $Add_{LRH}$ being 35, the fourth output $S324_{hex}$ can be 40 according to the operation of the logic gate 234 (such as, NOR). In some embodiments, the fourth output $S324_{hex}$=40 can be equivalent to the fourth output $S324_{dec}$=64.

For the fourth refresh cycle CBR+3, the switch 235" may select the fourth output S324 to be the first number 23A. The first number 23A can be 40 in hexadecimal (64 in decimal), and thus exceeds the first predetermined number (for example, 171 in decimal). Without triggering operation of the number trimmer 26, the first number 23A can be identical to the modified first number 23B for input to the counter 24. Accordingly, the initial countdown number $CDN_{hex}$ (the initial number of the counter 24), i.e., the modified first number 23B, can be 40 in hexadecimal. In some embodiments, the initial countdown number $CDN_{hex}$=40 can be equivalent to initial countdown number $CDN_{dec}$=64. In such a case, the counter 24 can count down from 64, and the address register 25 can be configured to obtain the word line address accessed at the activation act_64 between the refresh cycles CBR+3 and CBR+4 (see FIG. 4D).

Figure 4D:
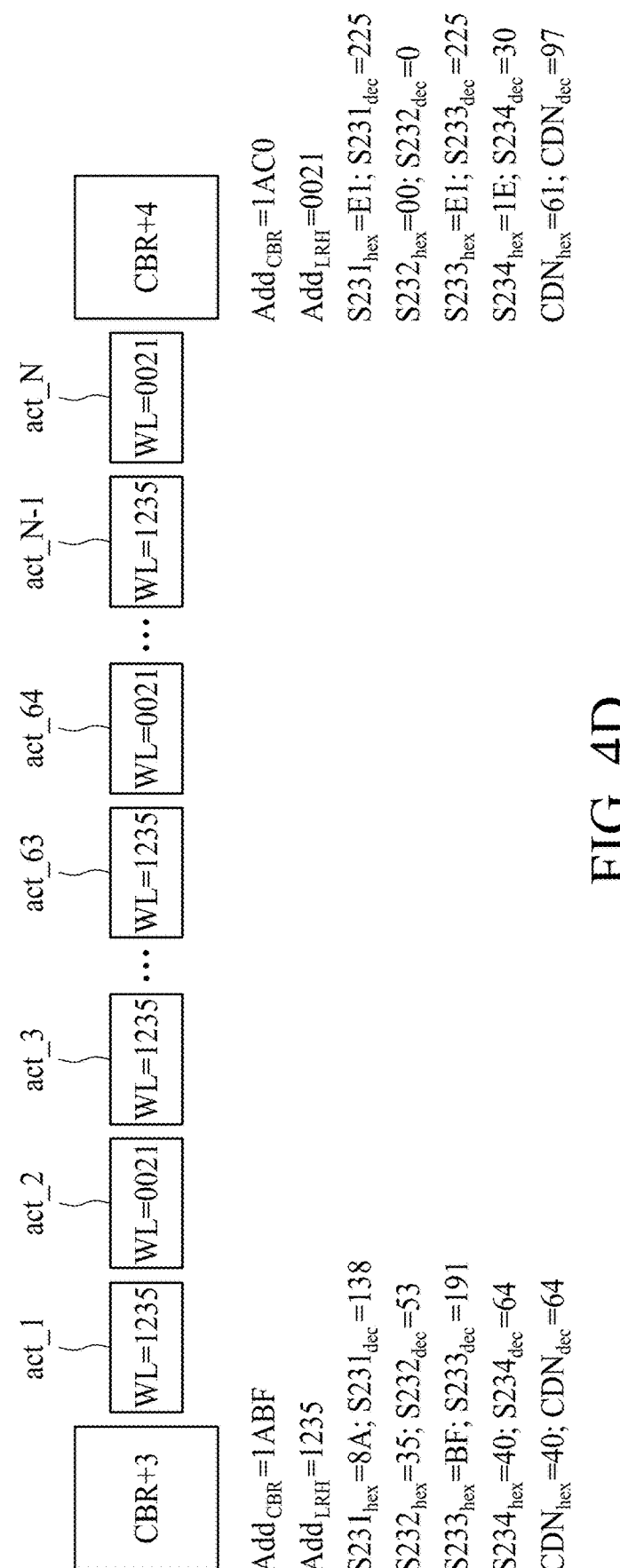
FIG. 4D is a schematic diagram illustrating accessed word line address between refresh cycles along a timeline, and a refresh word line address, a row hammer target word line address, and an initial countdown number in each refresh cycle, in accordance with some embodiments of the present disclosure.

FIG. 4D is a schematic diagram 4D illustrating accessed word line address between refresh cycles CBR+3 and CBR+4 along a timeline, and a refresh word line address $Add_{CBR}$, a row hammer target word line address $Add_{LRH}$, and an initial countdown number CDN in each refresh cycle, in accordance with some embodiments of the present disclosure.

Referring to FIG. 4D, the word line address WL of 1235 is accessed at the activation act_1. The word line address WL of 0021 is accessed at the activation act_2. The word line address WL of 1235 is accessed at the activation act_3. The word line address WL of 1235 is accessed at the activation act_63. The word line address WL of 0021 is accessed at the activation act_64. The word line address WL of 1235 is accessed at the activation act_N−1. The word line address WL of 0021 is accessed at the activation act_N. That is, only word line addresses 1235 and 0021 are accessed.

In the refresh cycle CBR+3, the refresh word line address $Add_{CBR}$ can be 1ABF, and the row hammer target word line address $Add_{LRH}$ can be 1235. As discussed in FIG. 4C, in response to the last 2 bits of the refresh word line address $Add_{CBR}$ being BF and the last 2 bits of the row hammer target word line address $Add_{LRH}$ being 35, the initial countdown number $CDN_{hex}$ can be 40 in hexadecimal in the refresh cycle CBR+3. In some embodiments, the initial countdown number $CDN_{hex}$=40 can be equivalent to initial countdown number $CDN_{dec}$=64. In such a case, the counter 24 can count down from 64, and the address register 25 can be configured to obtain the word line address accessed at the activation act_64 between the refresh cycles CBR+3 and CBR+4, i.e., WL of 0021. Accordingly, in the subsequent refresh cycle CBR+4, the row hammer target word line address $Add_{LRH}$ will also be 0021. That is, the adjacent word lines of 0021 (such as the word line addresses 0020 or 0022) can be protected in the refresh cycle CBR+4.

In the refresh cycle CBR+4, the refresh word line address $Add_{CBR}$ can be 1AC0, and the row hammer target word line address $Add_{LRH}$ can be 0021. The word line address WL of 1AC0 in hexadecimal can be equivalent to 6848 in decimal, and to 0001101011000000.

In response to the last 2 bits of the refresh word line address $Add_{CBR}$ being C0 and the last 2 bits of the row hammer target word line address $Add_{LRH}$ being 21, the first output $S321_{hex}$ can be E1 according to the operation of the logic gate 231 (such as, XOR). In some embodiments, the first output $S321_{hex}$=E1 can be equivalent to the first output $S321_{dec}$=225.

In response to the last 2 bits of the refresh word line address $Add_{CBR}$ being C0 and the last 2 bits of the row hammer target word line address $Add_{LRH}$ being 21, the second output $S322_{hex}$ can be 00 according to the operation of the logic gate 232 (such as, AND). In some embodiments, the second output $S322_{hex}$=00 can be equivalent to the second output $S322_{dec}$=0.

In response to the last 2 bits of the refresh word line address $Add_{CBR}$ being C0 and the last 2 bits of the row hammer target word line address $Add_{LRH}$ being 21, the third output $S323_{hex}$ can be E1 according to the operation of the logic gate 233 (such as, OR). In some embodiments, the third output $S323_{hex}$=E1 can be equivalent to the third output $S323_{dec}$=225.

In response to the last 2 bits of the refresh word line address $Add_{CBR}$ being C0 and the last 2 bits of the row hammer target word line address $Add_{LRH}$ being 21, the fourth output $S324_{hex}$ can be 1E according to the operation of the logic gate 234 (such as, NOR). In some embodiments, the fourth output $S324_{hex}$=1E can be equivalent to the fourth output $S324_{dec}$=30.

For the fifth refresh cycle CBR+4, the switch 235'' may select the first output S321 to be the first number 23A. The first number 23A can be E1 in hexadecimal (225 in decimal), and thus exceeds the first predetermined number (for example, 171 in decimal). After the operation of the number trimmer 26, the first number 23A can be reset to zero to become the modified first number 23B input to the counter 24. Accordingly, the initial countdown number $CDN_{hex}$ (the initial number of the counter 24), i.e., the modified first number 23B, can be 61 in hexadecimal. In some embodiments, the initial countdown number $CDN_{hex}$=61 can be equivalent to initial countdown number $CDN_{dec}$=97. In such a case, the counter 24 can count down from 97, and the address register 25 can be configured to obtain the word line address accessed at the activation act_97 between the refresh cycles CBR+4 and CBR+5 (not shown).

Referring to FIGS. 4A-4D, the address of the word line to be protected can be randomly selected from those word lines active during two refresh cycles. The word line is selected within those activated between refresh cycles. In such a case, the selection pool includes the word lines activated (i.e., the word line address of 0021 and 1235) between refresh cycles.

Figure 5:
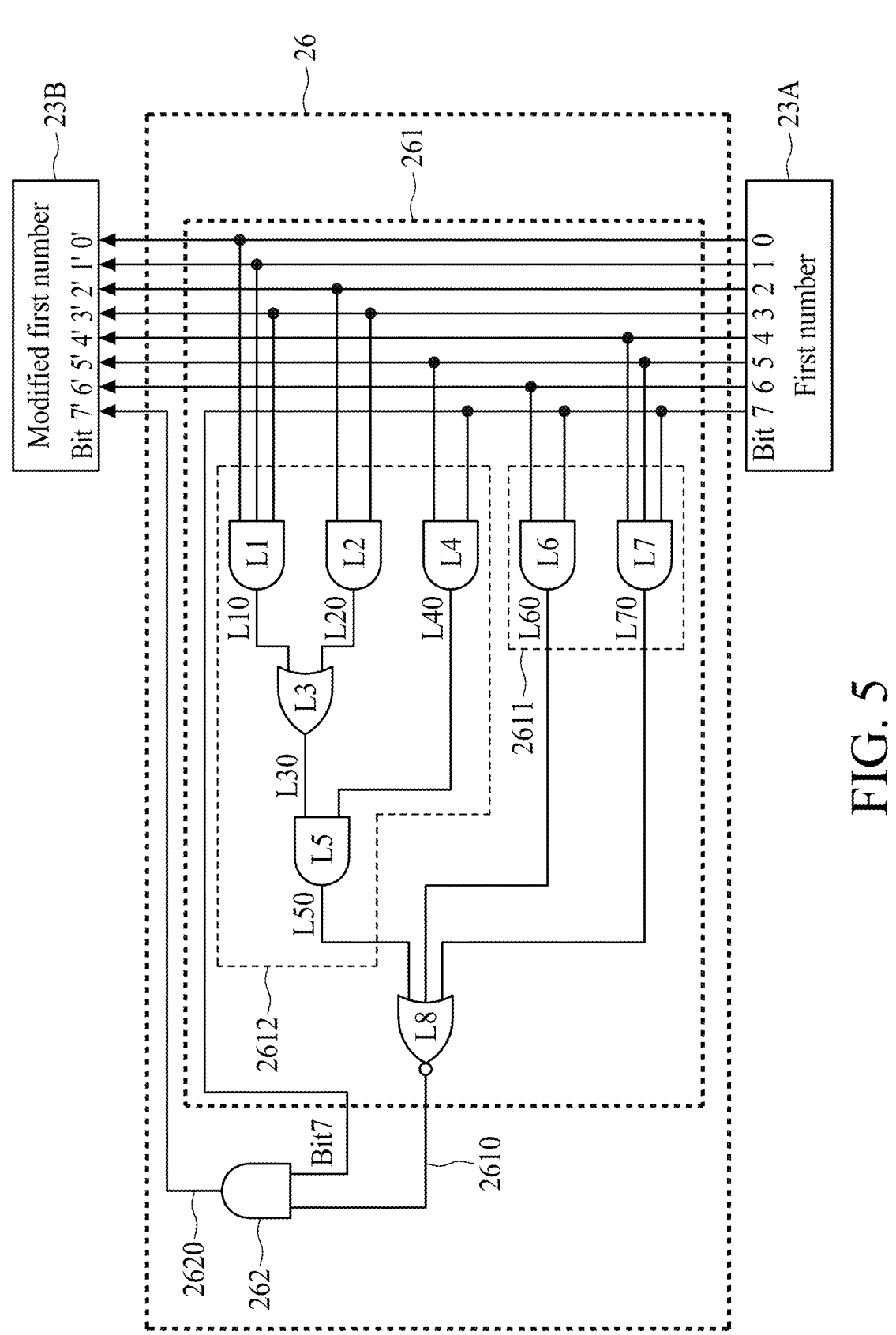
FIG. 5 is a schematic diagram of a number trimmer included in a memory device, in accordance with some embodiments of the present disclosure.

FIG. 5 is a schematic diagram of a number trimmer 26 included in a memory device, in accordance with some embodiments of the present disclosure. The number trimmer 26 is an embodiment of the number trimmer 26 shown in FIG. 2. The number trimmer 26 is configured to reset a most significant bit (msb) of the first number 23A when it is greater than the first predetermined number.

Referring to FIG. 5, the number trimmer 26 can include a determination unit 261 and an AND gate 262. The determination unit 261 can be configured to receive the first number 23A from the random number generator 23. In some embodiments, the determination unit 261 can be configured to determine whether the first number 23A is greater than the first predetermined number, and output a determination result 2610.

The AND gate 262 can have one input terminal connected to the random number generator 23, another input terminal connected to the determination unit 261, and an output terminal connected to the counter 24. In some embodiments, the AND gate 262 can be configured to receive the most significant bit Bit7 of the first number 23A and the determination result 2610, and generate an AND output 2620 in response to the most significant bit Bit7 of the first number 23A and the determination result 2610. In some embodiments, the AND gate 262 can be configured to transmit the AND output 2620 to the counter 24 as the most significant bit Bit7' of the modified first number 23B.

In principle, the output of a two input AND gate is true only when all input values are logic "1", and false if not all inputs to the AND gate are logic "1". Based on such calculation of AND gate 262, the AND output 2620 can be expressed as Truth Table 1.

| Truth Table 1 | | |
|---|---|---|
| Bit 7 | 2610 | 2620/Bit 7' |
| 0 | 0 | 0 |
| 0 | 1 | 0 |
| 1 | 0 | 0 |
| 1 | 1 | 1 |

In some embodiments, the determination result 2610 being logic high indicates that the first number 23A is less than the predetermined number. On the contrary, the determination result 2610 being logic low indicates that the first number 23A is greater than the predetermined number. Accordingly, when the determination result 2610 is logic low (logic "0") and Bit7 of the first number 23A is logic high (logic "1"), the AND output 2620 will be logic low to decrease the first number 23A to be the modified first number 23B. That is, the most significant bit (msb) of the first number 23A can be reset to logic "0". In some embodiments, when the first number 23A is greater than the first predetermined number, the number trimmer 26 can be configured to minus the first number 23A by 128 (i.e., 27) to be the modified first number 23B. For example, when the first number 23A is of 171, which is greater than the first predetermined number of 170, the number trimmer 26 can minus the first number 23A by 128 to generate the modified first number 23B of 42.

The determination unit 261 can be a circuit including one or more logic gates. In some embodiments, the determination unit 261 can include a first portion 2611, a second portion 2612, and a logic gate L8.

In some embodiments, the first portion 2611 can includes two AND gates L6 and L7. The AND gate L6 can have two input terminals connected to the random number generator 23, and configured to receive Bit5 and Bit7 of the first number 23A, respectively. The AND gate L6 is configured to generate an output L60 at an output terminal in response to Bit5 and Bit7 of the first number 23A. The AND gate L7 can have three input terminals connected to the random number generator 23, and configured to receive Bit4, Bit5, and Bit7 of the first number 23A, respectively. The AND gate L7 is configured to generate an output L70 at an output terminal in response to Bit4, Bit5, and Bit7 of the first number 23A.

The first portion 2611 can be configured to determine whether a first part of the binary sequence of the first number 23A is greater than a first threshold. In some embodiments, when the first number 23A is represented by a binary sequence having 8 bits, the first part of the binary sequence of the first number 23A can be 4 bits (for example, the first four digits). In some embodiments, the first threshold can be represented by a binary sequence having 4 bits (for example, the first four digits of the first predetermined number). For example, if the first predetermined number is 170, which can be represented as 10101010 in binary, the first threshold can be represented as 1010 in binary.

In some embodiments, the second portion 2612 includes AND gates L1, L2, L4, and L5, and an OR gate L3. The AND gate L1 can have three input terminals connected to the random number generator 23, and configured to receive Bit0, Bit1, and Bit3 of the first number 23A, respectively. The AND gate L1 is configured to generate an output L10 at an output terminal in response to Bit0, Bit1, and Bit3 of the first number 23A. The AND gate L2 can have two input terminals connected to the random number generator 23, and configured to receive Bit2 and Bit3 of the first number 23A, respectively. The AND gate L2 is configured to generate an output L20 at an output terminal in response to Bit2 and Bit3 of the first number 23A. The output terminals of the AND gates L1 and L2 are connected to the OR gate L3 as inputs. The OR gate L3 is configured to generate an output L30 at an output terminal in response to the outputs L10 and L20.

The AND gate L4 can have two input terminals connected to the random number generator 23, and configured to receive Bit5 and Bit7 of the first number 23A, respectively. The AND gate L4 is configured to generate an output L40 at an output terminal in response to Bit5 and Bit7 of the first number 23A. The AND gate L5 can have two input terminals connected to the OR gate L3 and the AND gate L4, respectively, and configured to receive the outputs L30 and L40, respectively. The AND gate L5 is configured to generate an output L50 at an output terminal in response to the outputs L30 and L40.

The second portion 2612 can be configured to determine whether a second part of the binary sequence of the first number 23A is greater than a second threshold in a condition of the first part of the binary sequence of the first number 23A greater than and equal to the first threshold. In some embodiments, when the binary sequence of the first number 23A has 8 bits, the second part of the binary sequence of the first number 23A can be 4 bits (for example, the last four digits). In some embodiments, the second threshold can be represented by a binary sequence having 4 bits (for example, the last four digits of the first predetermined number). For example, if the first predetermined number is 170, which can be represented as 10101010 in binary, the second threshold can be represented as 1010 in binary. In some embodiments, the AND gate L4 is configured to determine whether the first part of the binary sequence of the first number 23A is greater than and equal to the first threshold.

In some embodiments, each of the first portion 2611 and the second portion 2612 can compare a part of the first number 23A with a corresponding part of the first predetermined number. Then, the result of the first portion 2611 and the second portion 2612 can be combined and output a final determination result (i.e., the determination result 2610) by the logic gate L8.

In some embodiments, the logic gate L8 can be a NOR gate. The NOR gate L8 can be connected to the first portion 2611 and the second portion 2612. In some embodiments, the NOR gate L8 can have three input terminals connected to the AND gates L5, L6, and L7, respectively, and configured to receive the outputs L50, L60, and L70, respectively. In some embodiments, the NOR gate L8 is configured to generate the determination result 2610 at an output terminal in response to the outputs L50, L60, and L70. Based on such calculation of NOR gate L8, the determination result 2610 can be expressed as Truth Table 2.

| Truth Table 2 | | | |
|---|---|---|---|
| L50 | L60 | L70 | 2610 |
| 0 | 0 | 0 | 1 |
| 0 | 0 | 1 | 0 |
| 0 | 1 | 0 | 0 |
| 1 | 0 | 0 | 0 |
| 0 | 1 | 1 | 0 |
| 1 | 0 | 1 | 0 |
| 1 | 1 | 0 | 0 |
| 1 | 1 | 1 | 0 |

The NOR gate L8 outputs logic "1" only when the outputs L50, L60, and L70 are all logic "0". In some embodiments, the determination result 2610 being logic high indicates that the first number 23A is less than the predetermined number. On the contrary, the determination result 2610 being logic low indicates that the first number 23A is greater than the predetermined number. In such a case, the most significant bit (msb) of the first number 23A can be reset to logic "0" when the determination result 2610 is logic low and Bit7 of the first number 23A is logic high.

Taking the first predetermined number being 170 for example, the outputs of the logic gates of the number trimmer 26 can be expressed as Tables 1 to 5 when the first number 23A is 127, 128, 170, 171, and 187, respectively.

TABLE 1

| 23A | Bit 7 | Bit 6 | Bit 5 | Bit 4 | Bit 3 | Bit 2 | Bit 1 | Bit 0 |
|---|---|---|---|---|---|---|---|---|
| 127 | 0 | 1 | 1 | 1 | 1 | 1 | 1 | 1 |
| L10 | L20 | L30 | L40 | L50 | L60 | L70 | 2610 | 2620 |
| 1 | 1 | 1 | 0 | 0 | 0 | 0 | 1 | 0 |

TABLE 2

| 23A | Bit 7 | Bit 6 | Bit 5 | Bit 4 | Bit 3 | Bit 2 | Bit 1 | Bit 0 |
|---|---|---|---|---|---|---|---|---|
| 128 | 1 | 0 | 0 | 0 | 0 | 0 | 0 | 0 |
| L10 | L20 | L30 | L40 | L50 | L60 | L70 | 2610 | 2620 |
| 0 | 0 | 0 | 0 | 0 | 0 | 0 | 1 | 1 |

TABLE 3

| 23A | Bit 7 | Bit 6 | Bit 5 | Bit 4 | Bit 3 | Bit 2 | Bit 1 | Bit 0 |
|---|---|---|---|---|---|---|---|---|
| 170 | 1 | 0 | 1 | 0 | 1 | 0 | 1 | 0 |
| L10 | L20 | L30 | L40 | L50 | L60 | L70 | 2610 | 2620 |
| 0 | 0 | 0 | 1 | 0 | 0 | 0 | 1 | 1 |

25

TABLE 4

| 23A | Bit 7 | Bit 6 | Bit 5 | Bit 4 | Bit 3 | Bit 2 | Bit 1 | Bit 0 |
|---|---|---|---|---|---|---|---|---|
| 171 | 1 | 0 | 1 | 0 | 1 | 0 | 1 | 1 |
| L10 | L20 | L30 | L40 | L50 | L60 | L70 | 2610 | 2620 |
| 1 | 0 | 1 | 1 | 1 | 0 | 0 | 0 | 0 |

TABLE 5

| 23A | Bit 7 | Bit 6 | Bit 5 | Bit 4 | Bit 3 | Bit 2 | Bit 1 | Bit 0 |
|---|---|---|---|---|---|---|---|---|
| 187 | 1 | 0 | 1 | 1 | 1 | 0 | 1 | 1 |
| L10 | L20 | L30 | L40 | L50 | L60 | L70 | 2610 | 2620 |
| 1 | 0 | 1 | 1 | 1 | 0 | 1 | 0 | 0 |

The determination unit 261 shown in FIG. 5 is one exemplary circuit for determining whether the first number 23A is greater than the first predetermined number. In some embodiments, the determination unit 261 can be achieved by other configurations for determining whether the first number 23A is greater than the same first predetermined number. In another embodiments, to comparing the first number with different first predetermined number, the determination unit 261 can be achieved by different configurations according to needs.

The number trimmer 26 is provided to determine whether the random number (i.e., the first number 23A) exceeds the first predetermined number (i.e., the maximum number of activations between two refresh cycles), and then modify the random number to a range of 0 to the first determined number. The number trimmer 26 modifies the most significant bit of the first number 23A, such that the first number 23A can be modified slightly to maintain the randomness. The operations of number trimmer 26 do not relate to the process of the random number generator 23, and thus the randomness of the first number 23A would not be impacted.

FIG. 6 is a flowchart of a method 6 for protecting a memory device, in accordance with some embodiments of the present disclosure. In some embodiments, the method 6 is for protecting a word line included in the memory device. In some embodiments, the memory device can include a plurality of word lines.

In operation 61, a first output can be generated by a first logic gate according to an address of a first word line and an address of a first accessed word line, wherein the first word line and adjacent word lines of the first accessed word line are refreshed during a first refresh cycle. In some embodiments, the first logic gate (for example, the logic gate 231 in FIG. 2B) can be configured to generate the first output S321 according to the address of the word line $Add_{CBR}$ and the address of the accessed word line $Add_{LRH}$, i.e., the possible target row hammer word line located in the previous refresh cycle.

In some embodiments, the controller (for example, controller 22 in FIG. 2) of the memory device can refresh one or more word lines in each refresh cycle in response to the refresh signal. In some embodiments, in the first refresh cycle (for example, the refresh cycle CBR+1 in FIG. 4B), the controller can be configured to refresh one normal word line (such as the word line address 1ABD) according to the predetermined refresh pattern and one high-risk word line (such as the word line address 0020 or 0022, adjacent to the $Add_{LRH}$=0021).

Accordingly, in response to the last 2 bits of the refresh word line address $Add_{CBR}$ being BD and the last 2 bits of the row hammer target word line address $Add_{LRH}$ being 21, the first output S321 can be 9C in hexadecimal (156 in decimal) according to the operation of the logic gate 231 (such as, XOR).

In operation 62, a second output can be generated by a second logic gate according to the address of the first word line and the address of the first accessed word line. In some embodiments, the second logic gate (for example, the logic gate 232 in FIG. 2B) can be configured to generate the second output S322 according to the address of the word line $Add_{CBR}$ and the address of the accessed word line $Add_{LRH}$. Taking FIG. 4B for example, in response to the last 2 bits of the refresh word line address $Add_{CBR}$ being BD and the last 2 bits of the row hammer target word line address $Add_{LRH}$ being 21, the second output S322 can be 21 in hexadecimal (33 in decimal) according to the operation of the logic gate 232 (such as, AND).

In operation 63, one of the first output and the second output can be selected by a multiplexer to be a first number in response to a selection signal. In some embodiments, the multiplexer (for example, the multiplexer 235 in FIG. 2) can be configured to select one of the first output S231 and the second output S232 to be the first number 23A in response to the selection signal S0. In some embodiments, the first number 23A may be processed by the number trimmer 26 to become the modified first number 23B once it exceeds the first predetermined number (for example, 171).

In operation 64, a counter can start counting down from the first number. In some embodiments, the counter (for example, the counter 24 in FIG. 2) starts counting down from the first number 23A in response to the refresh signal RS. In some embodiments, each countdown is triggered by an accessing signal indicative of an access to one word line. In some embodiments, the operation 64 can be performed by the counter 24 shown in FIG. 2.

In operation 65, an address of a second accessed word line being accessed can be obtained by a controller when the counter counts to zero. In some embodiments, the address of the second accessed word line (for example, the word line address 1235 being accessed in the activation act_33 as shown in FIG. 4B) can be obtained and stored in an address register (for example, the address register 25 shown in FIG. 2) when the counter decrements to zero. The controller (for example, controller 22 in FIG. 2) can be configured to access the address register 25 and obtain the address of the second accessed word line. In some embodiments, the operation 65 can be performed by controller 22 with/without the address register 25 shown in FIG. 2.

In operation 66, a second protected word line can be refreshed during a second refresh cycle, wherein the second protected word line is adjacent to the second accessed word line. In some embodiments, the second protected word line can be refreshed during the second refresh cycle (for example, the word line address 1234 or 1236 can be refreshed during the refresh cycle CBR+2 as shown in FIG. 4B). In some embodiments, the operation 66 can be performed by controller 22 in FIG. 2.

To implement row hammer, a malicious operator tends to access one or more target word lines in a high frequency. The large amount of access to the target word line can lead to row hammer effect occurring on the word lines adjacent to the target word lines. That is, under the row hammer effect, content of nearby word lines may change by leaked charges, even if nearby word lines are not accessed.

The present disclosure provides a memory device that can determine a possible target word line to be attacked and protect word lines adjacent to the possible target word line. The random number generator can generate a random number to be an initial value of the counter, and the target word line address being accessed can be obtained when the counter reaches zero. In particular, the random number generator includes one or more logic gates which can generate a random number according to the refreshed word line address and the target word line address in the previous refresh cycle. The random number generator can further include a switch to select among the outputs of the logic gates to be the random number output to the counter. Accordingly, the number generated by the random number generator can be hard to predict. In addition, to avoid the random number exceeding the maximum number of activations between refresh cycles, the number trimmer modifies the random number to a range from zero to a predetermined number (i.e., the maximum number of activations between refresh cycles). Accordingly, word lines adjacent to the frequently accessed target word line can be refreshed to maintain content.

One aspect of the present disclosure provides a memory device. The memory device includes a plurality of word lines, a random number generator, a counter, and a controller. The random number generator is configured to receive an address of a first word line and an address of a first accessed word line, wherein the first word line and adjacent word lines of the first accessed word line are refreshed during a first refresh cycle. The random number generator includes a first logic gate, a second logic gate, and a switch. The first logic gate is configured to generate a first output according to the address of the first word line and the address of the first accessed word line. The second logic gate is configured to generate a second output according to the address of the first word line and the address of the first accessed word line. The switch is electrically coupled to the first logic gate and the second logic gate, and configured to select one of the first output and the second output to be a first number. The counter is electrically coupled to the random number generator, and the counter is configured to receive the first number and count down from the first number. The controller is configured to obtain an address of a second accessed word line being accessed when the counter counts down from the first number to zero, and refresh adjacent word lines of the second accessed word line during a second refresh cycle.

Another aspect of the present disclosure provides a memory device. The memory device includes a plurality of word lines a plurality of word lines, a random number generator, a counter, an address register, and a controller. The random number generator is configured to receive an address of a first word line and an address of a first accessed word line, wherein the first word line and adjacent word lines of the first accessed word line are refreshed during a first refresh cycle. The random number generator includes a first logic gate, a second logic gate, and a switch. The first logic gate is configured to generate a first output according to the address of the first word line and the address of the first accessed word line. The second logic gate is configured to generate a second output according to the address of the first word line and the address of the first accessed word line. The switch is electrically coupled to the first logic gate and the second logic gate, and configured to select one of the first output and the second output to be a first number. The counter is electrically coupled to the random number generator, and configured to receive the first number and count down from the first number. The address register is electrically coupled to the counter, and configured to store an address of a second accessed word line being active when the counter counts down to zero. The controller is configured to access the address register to obtain the address of the second accessed word line, and protect adjacent word lines of the second accessed word line during a second refresh cycle.

Another aspect of the present disclosure provides a method for protecting a memory device, wherein the memory device includes a plurality of word lines. The method includes generating, by a first logic gate, a first output according to an address of a first word line and an address of a first accessed word line, wherein the first word line and adjacent word lines of the first accessed word line are refreshed during a first refresh cycle; generating, by a second logic gate, a second output according to the address of the first word line and the address of the first accessed word line; selecting, by a multiplexer, one of the first output and the second output to be a first number in response to a selection signal; starting counting down from the first number by a counter; obtaining, by a controller, an address of a second accessed word line being accessed when the counter counts to zero; and refreshing a second protected word line during a second refresh cycle, wherein the second protected word line is adjacent to the second accessed word line.

The embodiments of the present disclosure provide a memory device having a protection circuit for selecting and protecting a vulnerable word line. In particular, the protection circuit of the memory device can protect word lines (memory cells) from row hammer. To trigger the row hammer, the malicious operator rapidly activates the same memory rows, such that the charges on adjacent memory rows that are not activated may leak. The present protection circuit provides a random number generator and a counter, so as to randomly select and protect a possible attacked memory row. The counter can be configured to count down from a random number generated by the random number generator. When the counter reaches zero, an address of the memory row that is activated can be obtained. In other words, the memory row is selected from those activated between refresh cycles. In such a case, the selection pool includes the memory rows activated between refresh cycles. The random number generator can generate the random number based on the address of the last refreshed word line address and the address of the last accessed word line (the selected possible attacked word line), such that unpredictability of the random number increases. In particular, the random number generator can include one or more logic gates which generate a random number according to the refreshed word line address and the target word line address in the last refresh cycle. The random number generator can further include a switch to select among the outputs of the logic gates to be the random number output to the counter, rendering the number generated by the random number generator more difficult to predict.

In addition, to avoid the random number generated by the random number generator exceeding the maximum number of activations between refresh cycles, the number trimmer modifies the random number to a range from zero to a predetermined number (i.e., the maximum number of activations between refresh cycles). Because the memory rows adjacent to the activated memory rows are more vulnerable to row hammer effect, they will be protected in the subsequent refresh cycle.

Generally, the activation amount triggering row hammer cannot be accomplished within two refresh cycles. For example, a memory device with 8192 rows can have about 170 activations between refresh cycles, and the activation amount for triggering the row hammer may be 10000 or more in the same row. Therefore, protecting additional vulnerable memory rows in every refresh cycle can eliminate the row hammer issue. Furthermore, the memory device can include a number trimmer circuit to determine whether the random number, for choosing one among memory rows, exceeds the maximum number of activations between refresh cycles (i.e., 170 in this case), and then decrease the random number to a range from 0 to 170, improving security and performance of the memory device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device, comprising:
  a plurality of word lines;
  a random number generator configured to receive an address of a first word line and an address of a first accessed word line, wherein the first word line and adjacent word lines of the first accessed word line are refreshed during a first refresh cycle, wherein the random number generator comprises:
    a first logic gate configured to generate a first output according to the address of the first word line and the address of the first accessed word line;
    a second logic gate configured to generate a second output according to the address of the first word line and the address of the first accessed word line; and
    a switch electrically coupled to the first logic gate and the second logic gate, and configured to select one of the first output and the second output to be a first number;
  a counter electrically coupled to the random number generator, wherein the counter is configured to receive the first number and count down from the first number; and
  a controller configured to obtain an address of a second accessed word line being accessed when the counter counts down from the first number to zero, and refresh adjacent word lines of the second accessed word line during a second refresh cycle;
  wherein the address of the first word line and the address of the first accessed word line are each represented by a hexadecimal sequence having 4 bits;
  wherein the controller is further configured to refresh a second word line during the second refresh cycle.

2. The memory device of claim 1, wherein the random number generator further comprises a third logic gate configured to generate a third output according to the address of the first word line and the address of the first accessed word line.

3. The memory device of claim 2, wherein the switch, in each refresh cycle, is configured to select in sequence the first output, the second output, and the third output to be the first number in response to a selection signal.

4. The memory device of claim 2, wherein the switch, in each refresh cycle, is configured to randomly select the first output, the second output, and the third output to be the first number in response to a selection signal.

5. The memory device of claim 1, wherein the first logic gate and the second logic gate include different types of logic gates.

6. The memory device of claim 1, wherein the first logic gate includes one of an OR gate, a AND gate, a NOR gate, a NAND gate, a XOR gate, or a XNOR gate.

7. The memory device of claim 1, wherein the switch includes a multiplexer.

8. The memory device of claim 1, wherein the random number generator is configured to generate the first number based on a first part of the address of the first word line and a first part of the address of the first accessed word line.

9. A memory device, comprising:
  a plurality of word lines;
  a random number generator configured to receive an address of a first word line and an address of a first accessed word line, wherein the first word line and adjacent word lines of the first accessed word line are refreshed during a first refresh cycle, wherein the random number generator comprises:
    a first logic gate configured to generate a first output according to the address of the first word line and the address of the first accessed word line;
    a second logic gate configured to generate a second output according to the address of the first word line and the address of the first accessed word line; and
    a switch electrically coupled to the first logic gate and the second logic gate, and configured to select one of the first output and the second output to be a first number;
  a counter electrically coupled to the random number generator, wherein the counter is configured to receive the first number and count down from the first number;
  an address register electrically coupled to the counter, and configured to store an address of a second accessed word line being active when the counter counts down to zero;
  a controller configured to access the address register to obtain the address of the second accessed word line, and protect adjacent word lines of the second accessed word line during a second refresh cycle; and
  a number trimmer configured to reset a most significant bit (msb) of the first number when the first number is greater than a first predetermined number;
  wherein the first logic gate and the second logic gate include different types of logic gates.

10. The memory device of claim 9, wherein the random number generator further comprises a third logic gate configured to generate a third output according to the address of the first word line and the address of the first accessed word line.

11. The memory device of claim 10, wherein the switch, in each refresh cycle, is configured to select in sequence the first output, the second output, and the third output to be the first number in response to a selection signal.

12. The memory device of claim 10, wherein the switch, in each refresh cycle, is configured to randomly select the first output, the second output, and the third output to be the first number in response to a selection signal.

13. The memory device of claim 9, wherein the first logic gate includes one of an OR gate, a AND gate, a NOR gate, a NAND gate, a XOR gate, or a XNOR gate.

14. The memory device of claim 9, wherein the switch includes a multiplexer.

15. The memory device of claim 9, wherein the address of the first word line and the address of the first accessed word line are each represented by a hexadecimal sequence having 4 bits.

16. The memory device of claim 15, wherein the random number generator is configured to generate the first number based on a first part of the address of the first word line and a first part of the address of the first accessed word line.

17. A method for protecting a memory device, wherein the memory device includes a plurality of word lines, the method comprising:

generating, by a first logic gate, a first output according to an address of a first word line and an address of a first accessed word line, wherein the first word line and adjacent word lines of the first accessed word line are refreshed during a first refresh cycle;

generating, by a second logic gate, a second output according to the address of the first word line and the address of the first accessed word line;

selecting, by a multiplexer, one of the first output and the second output to be a first number in response to a selection signal;

starting counting down from the first number by a counter;

obtaining, by a controller, an address of a second accessed word line being accessed when the counter counts to zero;

refreshing a second protected word line during a second refresh cycle, wherein the second protected word line is adjacent to the second accessed word line;

generating, by a third logic gate, a third output according to the address of the first word line and the address of the first accessed word line;

resetting, by a number trimmer, a most significant bit (msb) of the first number when the first number is greater than the first predetermined number; and refreshing a second word line during the second refresh cycle;

wherein the first logic gate and the second logic gate include different types of logic gates;

wherein the first number is less than a first predetermined number, wherein the first predetermined number is associated with a first time period for accessing a word line and a second time period between the first refresh cycle and the second refresh cycle.

18. The method of claim 17, wherein the selection among the first output, the second output, and the third output by the multiplexer is in sequence in each refresh cycle.

19. The method of claim 17, wherein the selection among the first output, the second output, and the third output by the multiplexer is random in each refresh cycle.

20. The method of claim 17, wherein the address of the first word line and the address of the first accessed word line are each represented by a hexadecimal sequence having 4 bits, and the first logic gate is configured to generate the first output based on a first part of the address of the first word line and a first part of the address of the first accessed word line.

* * * * *